US011677051B1

(12) United States Patent
Brodoceanu et al.

(10) Patent No.: US 11,677,051 B1
(45) Date of Patent: Jun. 13, 2023

(54) APPLICATION OF UNDERFILL VIA CENTRIFUGAL FORCE

(71) Applicant: Meta Platforms Technologies, LLC, Menlo Park, CA (US)

(72) Inventors: Daniel Brodoceanu, Cork (IE); Zheng Sung Chio, Cork (IE); Tennyson Nguty, Newcastle (GB); Chao Kai Tung, Cork (IE); Oscar Torrents Abad, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 98 days.

(21) Appl. No.: 16/784,523

(22) Filed: Feb. 7, 2020

(51) Int. Cl.
*H01L 33/52* (2010.01)

(52) U.S. Cl.
CPC ........ *H01L 33/52* (2013.01); *H01L 2933/005* (2013.01)

(58) Field of Classification Search
CPC ....... H01L 2224/73204; H01L 23/3157; H01L 21/563; H01L 2224/83855–8388; H01L 33/52; H01L 2933/005
See application file for complete search history.

(56) References Cited

U.S. PATENT DOCUMENTS

| 6,338,981 | B1* | 1/2002 | Klocke | H01L 21/563 438/126 |
| 2006/0246627 | A1* | 11/2006 | Feustel | H01L 21/563 438/106 |
| 2020/0063297 | A1* | 2/2020 | Kabany | D03D 1/0088 |
| 2020/0266078 | A1* | 8/2020 | Eom | H01L 24/13 |
| 2021/0296543 | A1* | 9/2021 | Aoyama | H01L 25/0753 |

* cited by examiner

*Primary Examiner* — Jay C Chang
*Assistant Examiner* — Mikka Liu
(74) *Attorney, Agent, or Firm* — Shook, Hardy & Bacon L.L.P.

(57) ABSTRACT

Embodiments described herein are directed towards enhanced systems and methods for applying underfill (UF) material to fill a gap between electrically coupled semiconductor devices in an integrated device. In some embodiments, uncured UF material may be applied to one edge of the gap, and capillary flow may be employed to distribute the uncured UF material into a first portion of the gap. To fill a second portion of the gap, accelerated motion may be employed. For example, the integrated device may be affixed to a centrifuge, and the centrifuge can be used to spin the integrated device to spread the uncured UF material further into the gap. In some embodiments, the accelerated motion may be employed to distribute the uncured UF material substantially uniformly within the gap. Once the uncured UF material has been spread out, one or more curing processes may be employed to cure the sandwiched UF material.

10 Claims, 16 Drawing Sheets

APPLICATION OF UNDERFILL VIA CENTRIFUGAL FORCE

BACKGROUND

The present disclosure relates to the manufacture and assembly of electronic display devices. Electronic displays are a core component of many computing devices, such as smart phones, tablets, smartwatches, laptops, desktops, televisions (TVs), and head-mounted devices (e.g., virtual reality (VR) devices, augmented reality (AR) devices, and/or mixed-reality (MR) devices). A modern display device may include a two-dimensional (2D) array of millions, or even tens of millions, of pixels. A 2D array of pixels can be arranged in rows and columns of pixels. For example, a 4K TV may include 4096 rows and 2160 columns of pixels (i.e., a 4096×2160 display), for close to nine million pixels.

Each pixel may include one or more light-emitting devices, sub-devices, or components, such as a light-emitting diode (LED). The LED may be an inorganic LED (ILED) or an organic LED (OLED). Each pixel may include multiple LEDs. For example, an RGB pixel may include three separate LEDs: a red (R) LED, a green (G) LED, and a blue (B) LED. Thus, modern displays may include well over ten million individual LEDs. The LEDs may be arranged in rows and columns on one or more backplanes or printed circuit boards (PCBs). When assembling the display, it is typically required to electrically couple, bond, or affix each of the LEDs to the backplane. This assembling process can leave a gap between the LEDs and the backplane.

SUMMARY

Embodiments described herein are directed towards enhanced systems and methods for applying underfill (UF) material to fill a gap between electrically coupled semiconductor devices in an integrated device. In some embodiments, uncured UF material may be applied to one edge of the gap, and capillary flow may be employed to distribute the uncured UF material into a first portion of the gap. However, the capillary flow of the UF material within the gap may be limited such that the distance the UF material travels may reach a plateau. As a result, the UF material may not adequately fill the gap and/or may not be uniformly distributed within the gap. To fill a second portion of the gap, accelerated motion may be employed. For example, the integrated device may be affixed to a centrifuge, and the centrifuge can be used to spin the integrated device to spread the uncured UF material further into the gap. In some embodiments, the accelerated motion may be employed to distribute the uncured UF material substantially uniformly within the gap. Once the uncured UF material has been spread out, one or more curing processes may be employed to cure the sandwiched UF material, thereby mechanically stabilizing the electrical bonds between the electrical contacts of the semiconductor devices.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein.

DETAILED DESCRIPTION

Figure 1A:
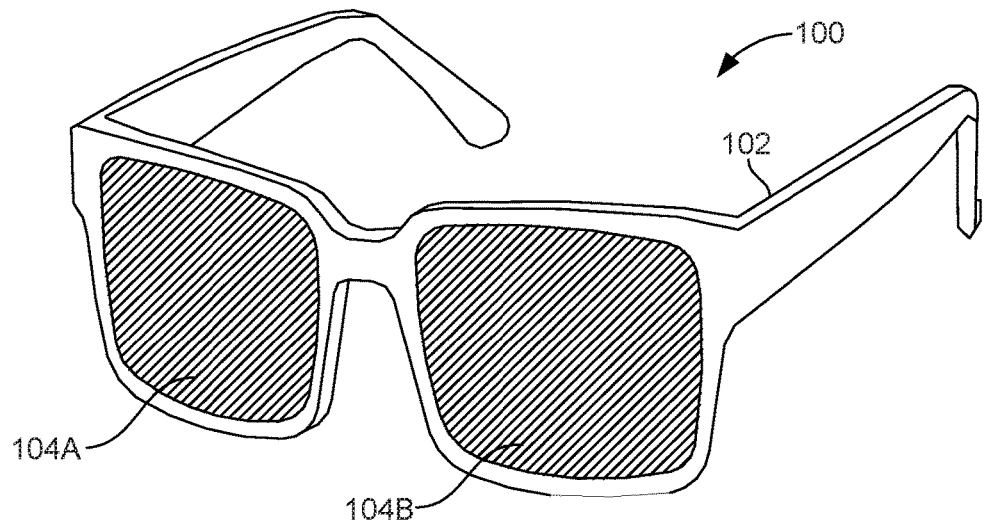
FIG. 1A is a diagram of a head-mounted device according to some embodiments.

Embodiments relate to systems and methods for applying underfill (UF) material to mechanically stabilize electrical bonds between semiconductor devices and improve device reliability.

By way of background, during the manufacture and assembly of electronic display devices and other types of electronics, various types of semiconductor devices can be electrically bonded to one another. For example, a light emitting component (LEC) such as an LED die can be bonded to a backplane, a printed circuit board (PCB), or some other target substrate. In some applications, a large group of semiconductor chips (e.g., an entire row of LEDs or µLEDs) may be bonded to a target substrate (e.g., a backplane of a display device). For example, a (full or partial) row of un-bonded LEDs may be positioned on a backplane, and the electrical contacts of each of the LEDs of the row may be bonded to corresponding electrical contacts of the backplane. A backplane for a modern display device may include thousands of rows of LEDs, each including thousands of individual LEDs. In some embodiments, the LEDs may be µLEDs with feature sizes (e.g., size of a dimension of the device, size of a dimension of the device's electrical contact or contact pad, etc.) less than 100 microns (µm) or just a few tens of In at least one embodiment, the feature sizes of a µLED are less than 1 micron, i.e., the feature sizes may be sub-micron. Thus, in various embodiments, millions (or even tens of millions) of LEDs may be affixed and bonded to a single backplane. The electrical bonds may be annealed or otherwise formed (e.g., via one or more photon beams) to strengthen the mechanical integrity of the electrical bonds and enhance the electrical performance and/or characteristics (e.g., reduced resistance, enhanced impedance matching, and the like) of the bonds.

Generally, an underfill (UF) material can be used to mechanically strengthen the electrical bonds between semiconductor devices and improve device reliability. Continuing with the example described above, the electrical contacts of each LED in a row of LEDs may be bonded to corresponding electrical contacts of the backplane (e.g., by scanning one or more pulsed photon beams across the row to selectively bond the LEDs to the backplane). As discussed herein, the term "electrical contacts" may include electrical interconnects, solder bumps, contact pads, or electrical leads. By bonding and/or annealing the electrical contacts between semiconductor devices, a gap or void may form between the semiconductor devices. An underfill (UF) material can be applied to the gap to mechanically couple, mechanically stabilize any alignment, and/or mechanically stabilize any electrical coupling between the semiconductor devices. In some scenarios, however, the distance between the semiconductor devices (e.g., the height of the gap) is small enough that it becomes challenging to apply the UF material into the gap. Some techniques may rely on capillary action (e.g., capillary flow) to distribute the UF material into the gap. However, the capillary flow of the UF material within the gap may be limited such that the distance the UF material travels into the gap may reach a plateau. As a result, the UF material may not adequately fill the gap and/or may not be uniformly distributed within the gap. Under these scenarios, the strength of the mechanical bond between semiconductor devices can be limited, which can lead to electrical contacts failure.

As such, various embodiments described herein are directed to systems and methods for applying UF material via centrifugal force, for example, after electrically bonding semiconductor devices to form an integrated semiconductor device. Generally, an integrated semiconductor device (or integrated device) may be formed by affixing, electrically bonding, and/or annealing bonds between two semiconductor devices, such as one or more LED dies electrically bonded to a backplane die (or some other target substrate). Generally, an UF material may be distributed between the inner surfaces of the bonded semiconductor devices (e.g., into the gap between semiconductor devices of the integrated device), forming a sandwich with the semiconductor devices. Note, as used throughout, UF material may include traditional UF materials, as well as dielectric polymers, such as but not limited to benzocyclobutene (BCB), highly-conductive polymers, and the like. The UF material may be similar to UF material employed in "flip-chip"-style semiconductor packaging.

In some embodiments, uncured UF material may be applied to a semiconductor device (e.g., to one edge of a gap between semiconductor devices of an integrated device), and capillary flow may be employed to distribute the uncured UF material into the gap (e.g., a first portion of the gap). Since capillary flow may not fill the entire gap, accelerated motion may be employed to distribute the UF material further into the gap (e.g., filling the rest of the gap). For example, the integrated device may be affixed to a centrifuge, and the centrifuge can be used to spin the integrated device. Such rotational motion can serve to spread the uncured UF material into a second portion of the gap and create a gradient distribution of UF nanoparticles along the axis of centrifugal motion. In some embodiments, the accelerated motion may be employed to distribute the uncured UF material substantially uniformly within the gap. In some embodiments, rather than applying uncured UF material into a gap between semiconductors of an integrated device, uncured UF material may be applied to any portion of a semiconductor device (or proximate to a semiconductor device), and an accelerated motion can be employed to distribute the uncured UF material along (or to) a surface or edge of the semiconductor device. Once the uncured UF material has been spread out, one or more curing processes (e.g., thermal, room temperature, pulsed and/or scanned photon beams, and the like) may be employed to cure the spread UF material (e.g., the sandwiched UF material).

The cured UF material may mechanically stabilize electrical bonds between the electrical contacts of the semiconductor devices. Additionally or alternatively, the cured UF material may prevent or reduce moisture ingress and thereby reduce electro-migration related failures. The cured UF material may also provide various benefits similar to those provided by conventionally applied and cured UF material, such as those associated with "flip-chip"-style packed semiconductor devices. For example, the cured UF material may redistribute any thermo-mechanical stress associated with a coefficient of thermal expansion (CTE) mismatch between the semiconductor devices. Further, the cured UF material may mechanically couple the semiconductor devices (e.g., the LED dies to the backplane), and thus may mechanically stabilize any alignment and/or electrical coupling between the semiconductor devices in the integrated device. In some embodiments, the integrated device may then be packaged. For example, the integrated device may be electrically coupled to a circuit board and/or packaging boards with input/output (I/O) pins. Thus, a circuit board may be populated with mechanically stabilized semiconductor devices using the techniques described herein.

Although embodiments are generally described herein as applying UF material, via centrifugal force, between bonded semiconductor devices forming an integrated semiconductor device, embodiments are not intended to be limited in scope. For example, UF material may be applied via centrifugal force in association with any semiconductor device(s). Some common examples of semiconductor devices include components with a semiconductor layer (e.g., semiconductor wafer, substrate, etc.), discrete devices (e.g., resistive elements, capacitors, diodes, transistors, etc.), integrated devices such as integrated circuits (e.g., microelectromechanical (MEMs) devices, logic devices such as processors or gate arrays, memory devices such as SRAM, DRAM, or EEPROM), some combination thereof, and the like.

Exemplary Embodiment of a Head-Mounted Computing Device

The light-emitting components (e.g., micro light-emitting diodes) may be used in a near-eye display (NED) device included in a head-mounted device (HMD). As such, various embodiments of NEDs and HMDs will now be discussed. FIG. 1A is a diagram of a head-mounted device (HMD) 100 according to some embodiments. HMD 100 is one example embodiment of a head-mounted computing device. As such, HMD 100 may include a near-eye display (NED), which may include one or more display devices. The depicted embodiment includes a left display device 104A and a right display device 104B, which may be collectively referred to as the display device 104. The display device 104 may present content to a user. Examples of content presented by display device 104 may include, but are not limited to, one or more images, a series of images (e.g., a video), virtual objects, audio, or some combination thereof. As discussed throughout, display device 104 may include one or more arrays of light-emitting components, such as but not limited to one-dimensional (1D) or two-dimensional (2D) arrays of light-emitting diodes (LEDs). The light-emitting components may be affixed or bonded to a backplane of the display device 104.

In some embodiments, audio content may be presented via an audio device (e.g., speakers and/or headphones) of HMD 100. The audio device may receive audio content or information from the display device 104, a controller or processing unit of the HMD 100 (not shown), or an external device. The display device 104 may generally be configured to operate as an augmented-reality (AR) NED, such that a user can simultaneously view content projected (or otherwise presented) by the display device 104, and their real-world environment through the display device 104. In such embodiments, the display device 104 may augment views of a physical, tangible, and real-world environment with computer-generated (or virtual) elements (e.g., content including images, video, sound, and the like). However, in some embodiments, the display device 104 may be modified to additionally, or in the alternative, operate as a virtual-reality (VR) NED, a mixed-reality (MR) NED, or some combination thereof.

In addition to display device 104, HMD 100 may include a support or frame 102 that secures the display devices 104 in place on the head of a user. In some embodiments, the frame 102 may be a frame of eyewear glasses. HMD 100 may include at least one of a controller or a processing unit (e.g., a central processing unit, microcontroller, or microprocessor), a non-transitory, computer-readable storage device (e.g., volatile or non-volatile memory devices), and a communication transceiver (e.g., a wireless and/or wired network adaptor). As described herein in conjunction with some exemplary embodiments, the display device 104 may include a waveguide and holographic and/or volumetric Bragg gratings. The gratings may be generated by a process of applying one or more dopants or photosensitive media to predetermined portions of the surface of the waveguide, and subsequent exposure to ultraviolet (UV) light or other activating electromagnetic (EM) radiation. The various operations and/or functionalities of HMD 100 may be controlled via executing instructions on a processor device and/or controller device. When the instructions are executed, the processor device and/or controller device may cause the performance of various actions and/or steps. The instructions may be stored on a non-transitory computer-readable storage medium.

Figure 1B:
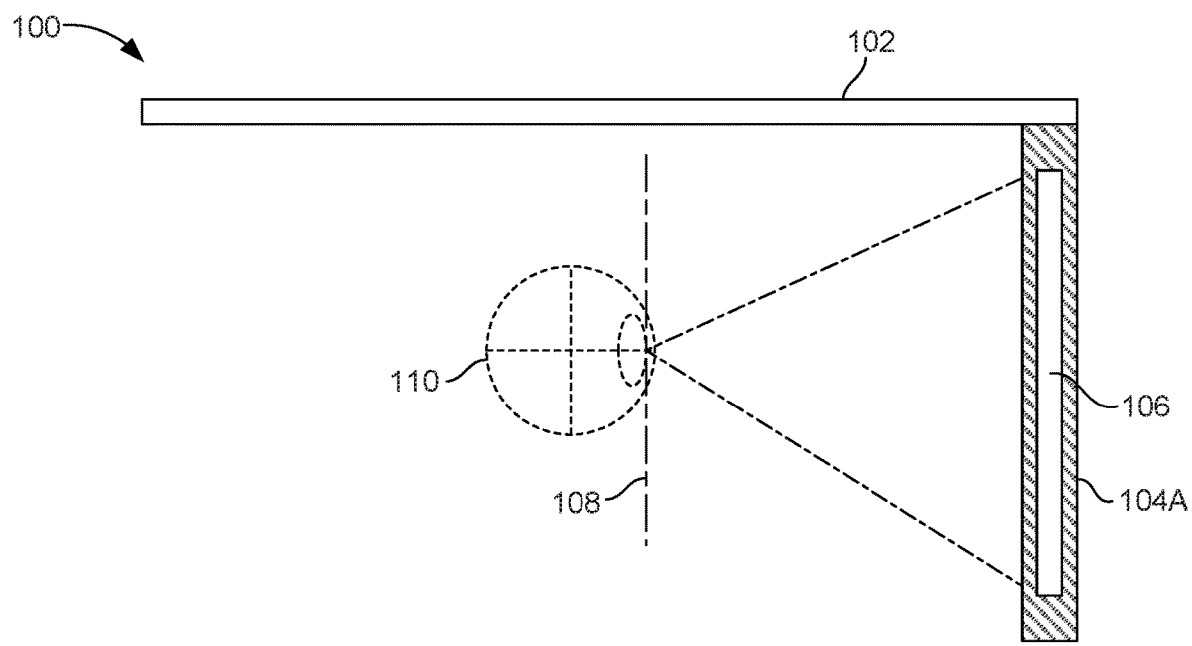
FIG. 1B illustrates a cross-sectional view of a portion of the head-mounted device of FIG. 1A, in accordance with some embodiments.

FIG. 1B illustrates a cross-sectional view of a portion of HMD 100, as shown in FIG. 1A, in accordance with some embodiments. The portion of the HMD 100 shown in FIG. 1B is associated with a single eye 110 of a user. The display device 104A may include at least one waveguide configuration 106. FIG. 1B shows an eye-box 108, which may be a location where the user's eye 110 is positioned when the user wears the HMD 100. When the eye 110 is aligned with the eye-box 108, the user may be visually provided a projected image, via the waveguide configuration 106. Waveguide configuration 106 directs the projected image towards the eye-box 108. The waveguide configuration 106 may receive and direct multiple pupil replications (i.e., replications of an image) towards the eye-box 108. For purposes of illustration, FIG. 1B shows a cross-section associated with a single eye 110 of the user and a single waveguide configuration 106. In some alternative embodiments, another waveguide configuration (which may be separate from the waveguide configuration 106 shown in FIG. 1B) may provide image light to another eye-box located with the other eye of the user, e.g., a waveguide configuration included in each of display devices 104A-104B of FIG. 1A.

The waveguide configuration 106, as illustrated in FIG. 1B, may be configured to direct image light (i.e., light that forms an image) to eye-box 108, which is positioned proximate the eye 110. The waveguide configuration 106 may be composed of one or more optical materials (e.g., plastic, glass, and the like) with one or more refractive indices that effectively minimize weight and widen a field-of-view (FOV) of the display device 104A. In alternative embodiments, the display device 104A may include one or more optical elements between the waveguide configuration 106 and the eye 110. The optical elements may act to manipulate light emitted from the display device 104A (e.g., image light emitted from display device 104A), perform one or more other optical adjustments to the light, or some combination thereof. Non-limiting examples of optical elements include an aperture, a Fresnel lens, a refractive (e.g., convex and/or convex) lens, a reflective surface, a filter, or any other suitable optical elements that manipulates light. Although not shown in FIG. 1B, the waveguide configuration 106 may include a waveguide with one or more sets of Bragg gratings.

In some embodiments, in order to achieve desired optical specifications or criteria, such as but not limited to a desired viewing angle, a maximum aperture size, a desired resolution, a minimum distortion level, a color correction, a back focal distance, and the like, the lenses (and other optical elements) described herein may include various designs. The lens or lenses may include a cylindrical lens, an anamorphic lens, a Fresnel lens, a gradient index lens, and the like. The lens may include a super lens, at least a portion of which having a negative index of refraction. The lens may include multiple lenses having various shapes. In some embodiments, the lens or lenses may include various optical materials. For example, a lens may include glass. In another non-limiting example embodiment, a lens can include a plastic material, such as but not limited to a CR-39 lens material, a urethane-based polymer, or a polycarbonate material.

Figure 2A:
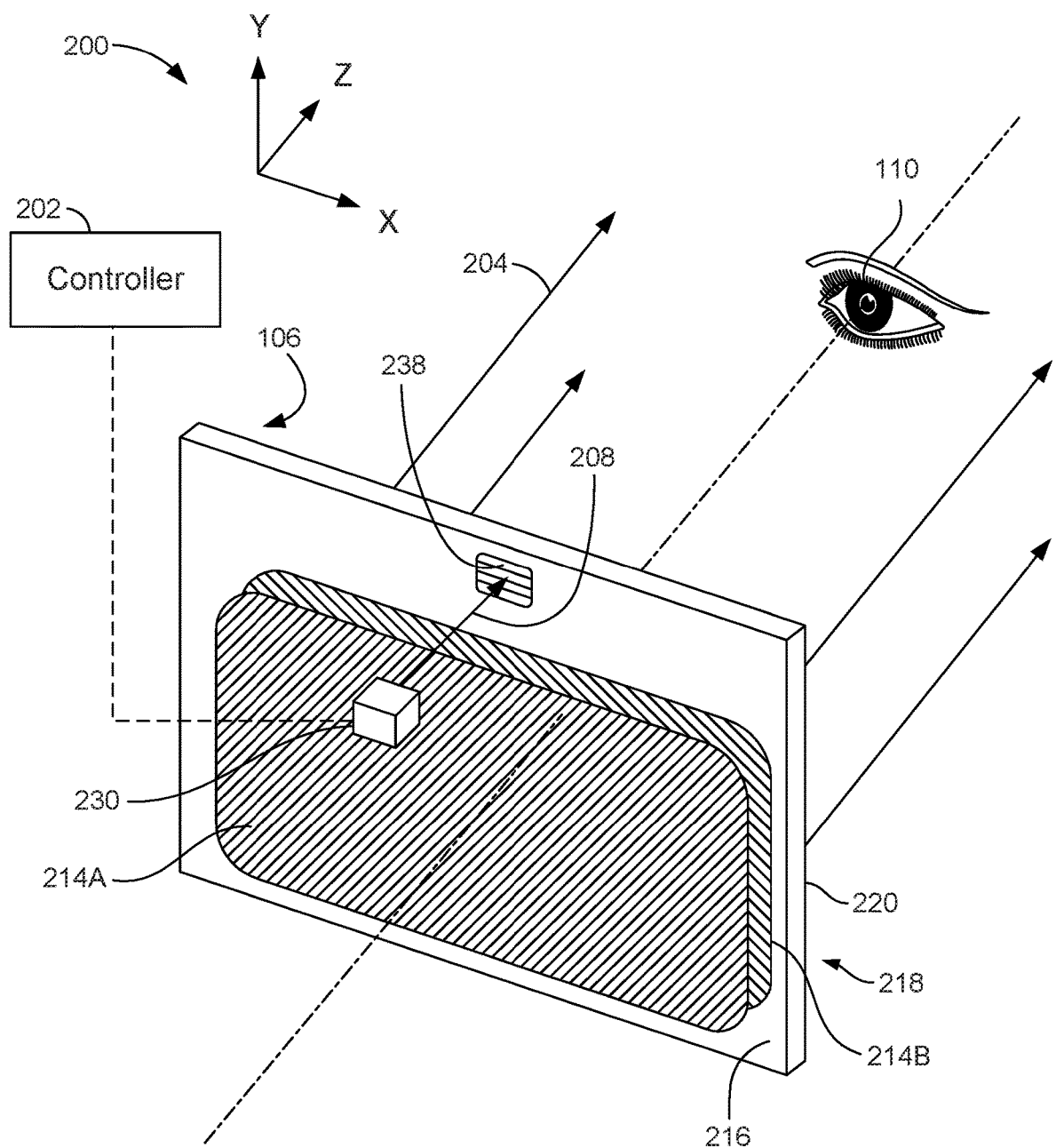
FIG. 2A illustrates an isometric view of an embodiment of a display device that is included in a head-mounted device.

FIG. 2A illustrates an isometric view of an embodiment of a display device 200 that is included in a head-mounted device. The various operations and/or functionalities of display device 200 may be controlled via executing instructions on a processor device and/or controller device. When the instructions are executed, the processor device and/or controller device may cause the performance of various actions and/or steps. The instructions may be stored on a non-transitory computer-readable storage medium.

Display device 200 may be included in HMD 100 of FIGS. 1A-1B. As such, display device 200 may be an embodiment of (or at least be similar to) display devices 104A-104B of FIGS. 1A-1B. In addition to the components discussed in conjunction with FIGS. 1A-1B, display device 200, or other components of HMD 100, may include source assembly 230, waveguide configuration 106, and controller 202. Waveguide configuration 106 may include at least a waveguide 220, a coupling element 236, a first (or top) decoupling element 214A, and a second (or bottom) decoupling element 214B. Waveguide 220 may include a top surface 216 and a bottom surface 218.

As shown in FIG. 2A, the bottom surface 218 of waveguide 220 and the second decoupling element 214B are facing the user's eye 110, while the top surface 216 of waveguide 220 and the first decoupling element 214A are facing towards the user's field-of-view (FOV) of the user's environment. Thus, the bottom surface 218 may be referred to as the user's surface of waveguide 220 and the second decoupling element 214B may be referred to as the user's decoupling element. In contrast, the top surface 216 may be referred to as the environment's surface of waveguide 220 and the first decoupling element 214A may be referred to as the environment's decoupling element. As discussed throughout, second decoupling element 214B outputs post-waveguide image light 204 to the user's eye 110. Thus, second decoupling element 214B may be referred to as the output decoupling element. As discussed in conjunction with FIGS. 2B-2C, source assembly 230 may include a light source and/or an optics system. In at least one embodiment, source assembly 230 may be referred to as a projector device, or simply a projector. Source assembly 230 may be an embodiment of (or at least be similar to) source assembly 230 of FIG. 2C.

Controller 202 may be an example of a central processing device (CPU), graphics processing unit (GPU), microcontroller, microprocessor, or some other logic-executing device, e.g., a field-programmable gate array (FPGA) or an application-specific integrated circuit (ASIC). Similar to FIG. 1B, display device 200 of FIG. 2A is associated with a single eye 110 of a user. As discussed in conjunction with FIG. 1A, another display device included in HMD 100 may provide image light to the user's other eye. In some embodiments, one or more components of HMD 100 may be shared between the separate display devices for each eye. In still other embodiments, the single waveguide configuration 106 or display device 200 may provide post-waveguide image light 204 to both of the user's eyes. Waveguide 220 may be one of one or more waveguides included in waveguide configuration 106.

The source assembly 230 may generate pre-waveguide image light 208 that enters waveguide configuration 106, is transmitted via waveguide 220, and exits waveguide configuration 106, as post-waveguide image light 204. As used herein, prior to entering waveguide configuration 106, via coupling element 238, the image light may be referred to as pre-waveguide image light 208. After the transmitted image light exits waveguide configuration 106, via second decoupling element 214B, the image light may be referred to as post-waveguide image light 204. The pre-waveguide image light 208 may form one or more two-dimensional (2D) monochromatic or multi-chromatic images. The one or more images may be received by waveguide, via coupling element 238. The one or more images may be transmitted through waveguide 220 and outputted towards the user's eye 110, via waveguide 220 second decoupling element 214B. The post-waveguide image light 204 may provide the transmitted one or more 2D images to user's eye 110. In various embodiments, waveguide 220 is an output waveguide, because it outputs image light that is directed towards and received by the user's eye 110.

Figure 2B:
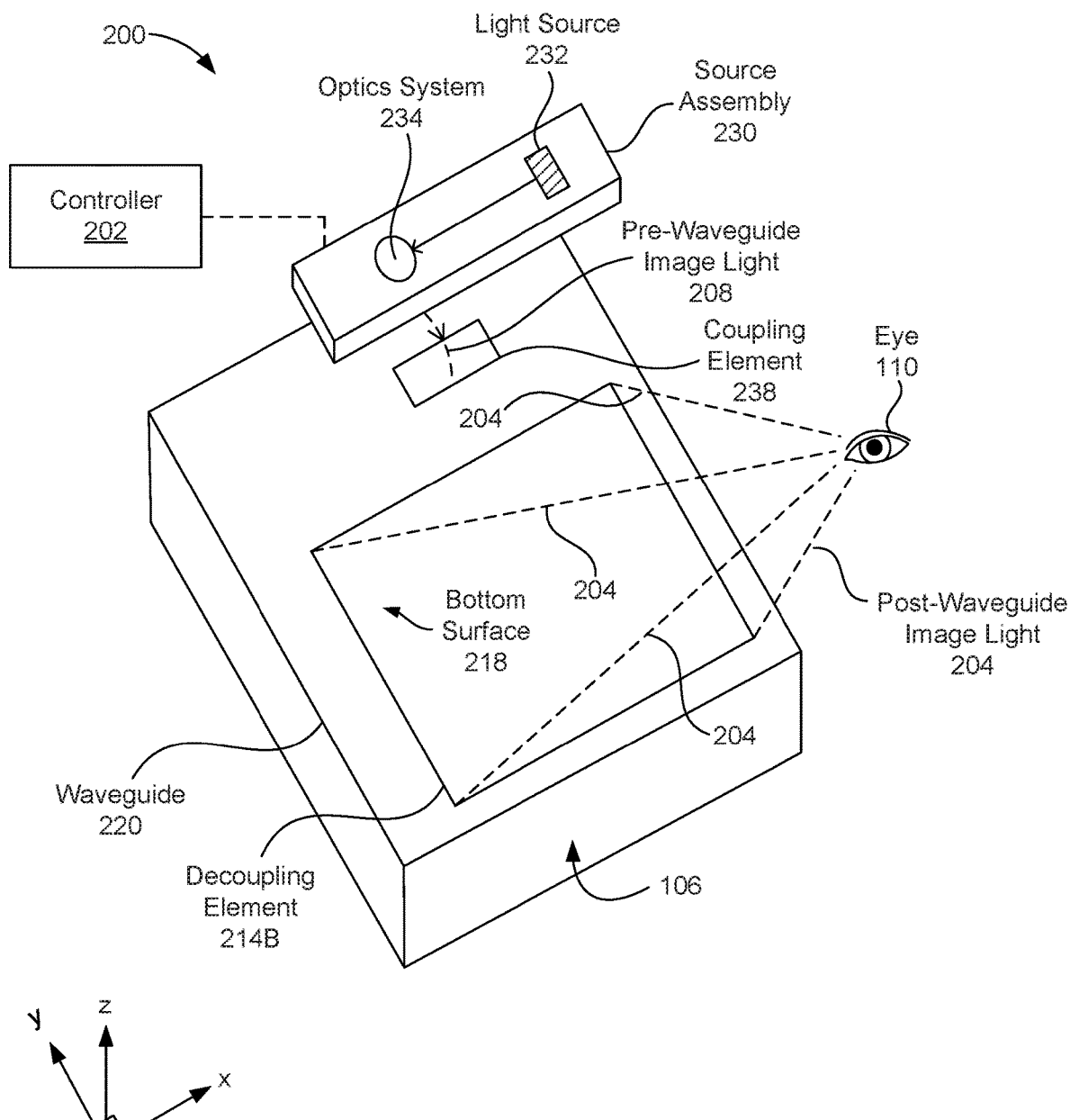
FIG. 2B illustrates a perspective view of another embodiment of a display device that is included in a head-mounted device.
Figure 2C:
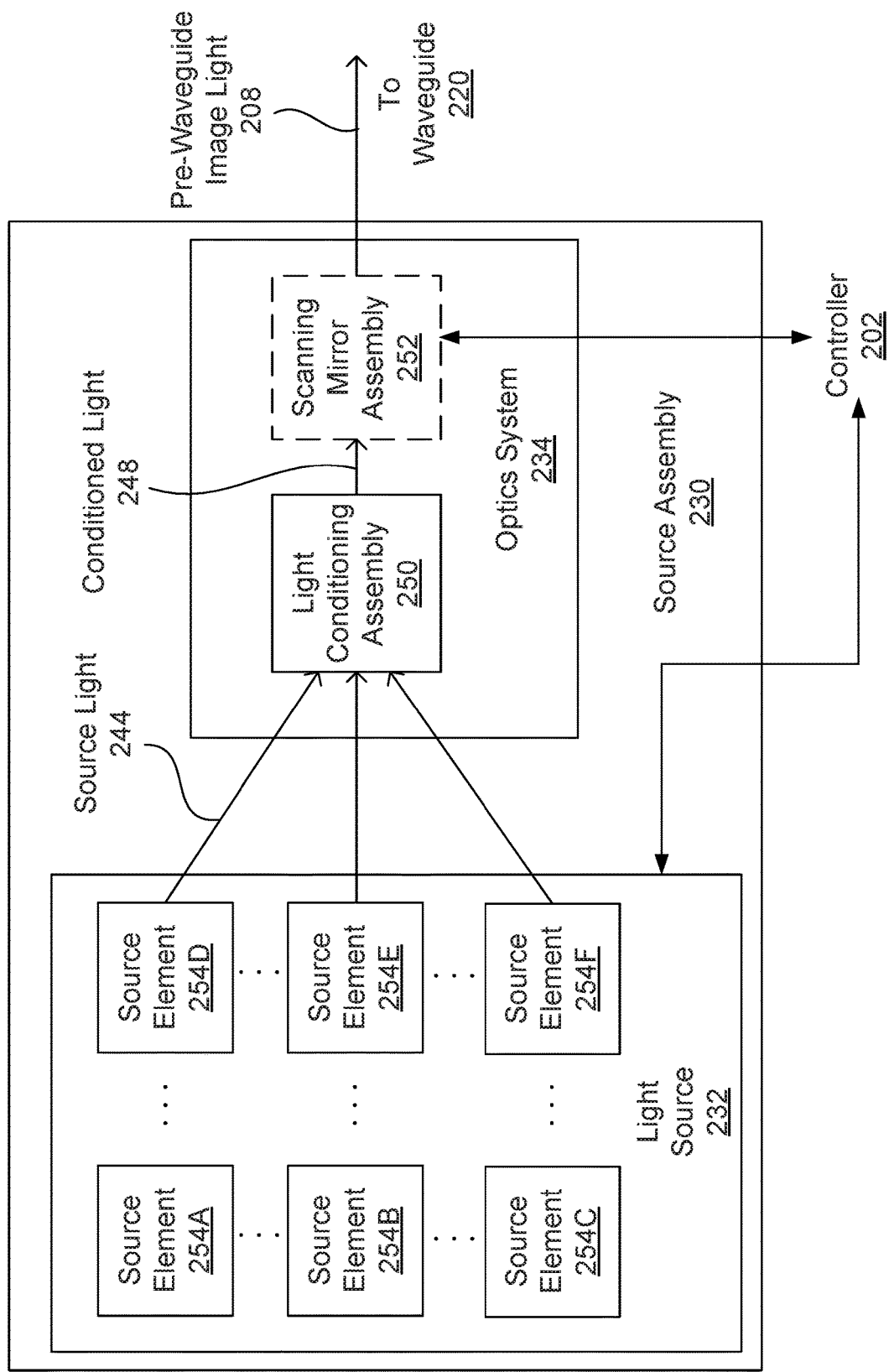
FIG. 2C illustrates a block diagram of the source assembly 230 of FIGS. 2A-2B, in accordance with various embodiment.

Various embodiments of source assembly 230 are described in conjunction with at least FIGS. 2B-2C. As shown in FIGS. 2B-2C, source assembly 230 may include one or more 1D or 2D monochromatic or multi-chromatic light sources and an optics system. Various embodiments of light sources and optics systems are described in conjunction with at least FIGS. 2B-2C, 3, and 4. However, briefly here, light source (e.g., light source 232 of FIG. 2B-2C) may generate the pre-waveguide image light 208. The light source may include arrays (e.g., emitter arrays) of monochromatic or multi-chromatic light-emitting components (e.g., LEDs) which generate image light. The light-emitting components may be bonded to a backplane of source assembly 230. The light source may generate source light and the optics system may condition the source light to project the pre-waveguide image light 208 towards coupling element 238 located on the top surface 216 of the waveguide 220. The projected pre-waveguide image light 208 may include 2D image light that forms one or more 2D images.

In at least some embodiments, an optics system of the source assembly 230 may include a scanning mirror assembly that includes a scanning mirror that scans the generated pre-waveguide image light 208. The scan patterns of the scanning mirror assembly are such that the scanned pre-waveguide image light 208 forms the one or more 2D images. Such non-limiting embodiments may be referred to as scanning embodiments. The pre-waveguide image light 208 may propagate along a dimension or direction towards the coupling element 238, where the pre-waveguide image light 208 is received by and/or coupled to waveguide 220.

The waveguide 220 may be an optical waveguide that outputs 2D images, via 2D post-waveguide image light 204 that is directed to the eye 110 of the user. The waveguide 220 may receive pre-waveguide image light 208, projected via source assembly 230, at coupling element 238. The coupling element 238 may include one or more coupling elements located on the top surface 216 and/or within the body of waveguide 220. Coupling element 238 may guide and/or couple the received pre-waveguide image light 208 to a propagation area of the waveguide 220. Coupling element 238 may include a diffraction grating, a holographic grating, one or more cascaded reflectors, one or more prismatic surface elements, an array of holographic reflectors, a meta-material surface, or some combination thereof. An exemplary, but non-limiting, embodiment of the coupling element 238 may include a grating having a pitch of approximately 300 nm to approximately 600 nm. The coupling element 238 may be understood as extending from the top surface 216 to the bottom surface 218 of the waveguide 220. The coupling element 238 may redirect received pre-waveguide image light 208, according to a first grating vector, into the propagation area of the waveguide 220. Waveguide 220 may be included in and/or formed in the body of waveguide configuration 106. Waveguide 220 may be positioned between the first and second decoupling elements 214A-214B.

The first decoupling element 214A may redirect internally reflected image light from the waveguide 220. The second de-coupling element 214B may decouple the image light from waveguide 220 and direct the image light towards eye 110. In some embodiments, the internally-reflected image light may be totally, or at least near totally, internally reflected. The first decoupling element 214A may be part of, affixed to, or formed in the top surface 216 of the waveguide 220. The second decoupling element 214B may be part of, affixed to, or formed in the bottom surface 218 of the waveguide 220, such that the first decoupling element 214A is opposed to the second decoupling element 214B. A light propagation area may extend between decoupling elements 214A-214B. In some embodiments, there may be an offset between the opposed decoupling elements 214A-214B. The offset may be along the x-axis and/or the y-axis of the 3D Cartesian coordinates illustrated in FIG. 2A. The decoupling elements 214A-214B may include a diffraction grating, a holographic grating, a volumetric Bragg grating, one or more cascaded reflectors, one or more prismatic surface elements, an array of holographic reflectors, or the like. The decoupling elements 214A-214B may form a decoupling area of HMD 100.

In scanning embodiments, display device 200 may be a scanning display device. Various embodiments of scanning display devices are discussed in conjunction with FIGS. 2C and 5A. However, briefly here, source assembly 230 may provide one or more 1D or 2D images via scanning projected light at a scanning rate sufficient to form an apparent image. As such, source assembly 230 may include one or more scanning mirrors. However, in other embodiments, the display device 200 is not a scanning display device, and display device 200 is not required to include a scanning mirror.

Whether a scanning embodiment or a non-scanning embodiment, source assembly 230 may project a 2D image on an image field through waveguide 220, via one or more arrays of light-emitting components (i.e., emitter arrays) included in source assembly 230. In some embodiments, the image emitted by emitter arrays may be conditioned and/or magnified by an optics system and/or light conditioning assembly (e.g., one or more lenses) before the pre-waveguide image light 208 is received by waveguide 220. Such optics systems are discussed in conjunction with at least optics systems 234 of FIGS. 2B-2C.

In various embodiments, an orientation and/or position of post-waveguide image light 204 exiting from waveguide 220 may be controlled by changing an orientation of the pre-waveguide image light 208 entering the coupling element 238. In such embodiments, scanning components included in an optics system of source assembly 230 may re-orient and/or re-position pre-waveguide image light 208 prior to image light entering coupling element 238.

In various embodiments, one or more logic devices (such as controller 202) may control the operations of source assembly 230. As noted above, controller 202 may include any logic device, such as but not limited to a microprocessor, microcontroller, central processing unit (CPU), graphical processing unit (GPU), gate arrays (e.g., an FPGA), an ASIC, or the like. The controller 202 may generate display instructions for the source assembly 230. The display instructions may include instructions to project one or more monochromatic or multi-chromatic images. Display instructions may include an image file (e.g., a bitmap). The display instructions may be received from another processing device included in HMD 100, a memory device of HMD 100, non-transitory computer-readable media, and/or a wireless/wired communication network. As described herein, the display instructions may further include instructions for moving (e.g., scanning) optical components within the source assembly 230, or individual light-emitting arrays included therein, or for moving the waveguide 220 by activating an actuation system. The controller 202 may include a combination of hardware, software, and/or firmware not explicitly shown herein so as not to obscure other aspects of the disclosure. The software and/or firmware may be stored via a storage device or non-transitory computer-readable media of HMD 100 or another computing device.

FIG. 2B illustrates a perspective view of another embodiment of display device 200. The embodiment of display device 200, shown in FIG. 2B, may also be included in a HMD, such as but not limited to HMD 100 of FIGS. 1A-1B. The embodiment of display device 200 shown in FIG. 2B may be an embodiment of (or at least similar to) any of display devices 104A-104B of FIGS. 1A-2A or display device 200 of FIG. 2A. Similarly to the embodiment shown in FIG. 2A, display device 200 includes various components, e.g., the waveguide configuration 106 or part of the waveguide configuration 106, controller 202, and source assembly 230. In alternative embodiments, the display device 200 is included in other HMDs, or in other systems that provide projected image light to a particular location.

Similar to the embodiment shown in FIG. 2A, display device 200 of FIG. 2B includes waveguide configuration 106. Waveguide configuration 106 includes waveguide 220, coupling element 238, and decoupling element 214B. Due to the perspective view of FIG. 2B, the bottom surface 218 of waveguide 220 is shown, but the top surface 216 of waveguide 220 is occluded by waveguide configuration 106. Similarly, the second decoupling element 214B is visible in FIG. 2B, but the first decoupling element 214A is occluded by the waveguide configuration 106. As shown in more detail in FIG. 2C, source assembly 230 may include light source 232 and optics system 234. Optics system 234 may include a light conditioning assembly 250. In various scanning embodiments, display device 200 may be a scanning display device. In such embodiments, optics system 234 may include a scanning mirror assembly.

Figure 5A:
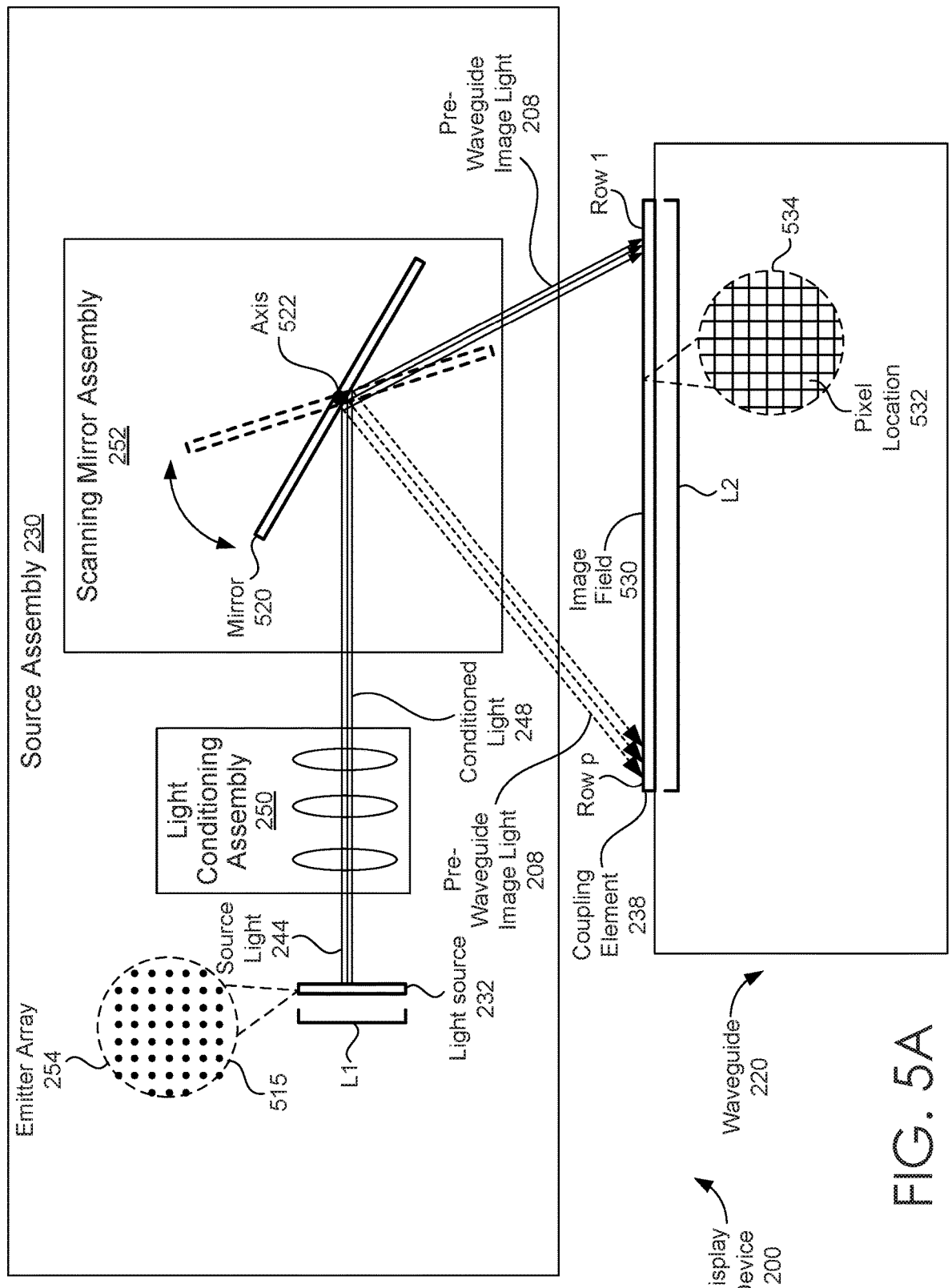
FIG. 5A is a diagram illustrating a scanning operation of a scanning embodiment of display device, in accordance with an embodiment.

Various embodiments of a scanning display device are discussed in conjunction with at least FIG. 2C and FIG. 5A. However, briefly here, display device 200 may provide one or more 1D or 2D images via scanning projected light at a scanning rate sufficient to form an apparent image. As such, display device 200 may include one or more scanning mirrors. For instance, a scanning mirror assembly, which includes a scanning mirror, may be included in an optics system of source assembly 230. However, in other embodiments, the display device 200 is a non-scanning display device, and display device 200 need not include a scanning mirror assembly.

Figure 5B:
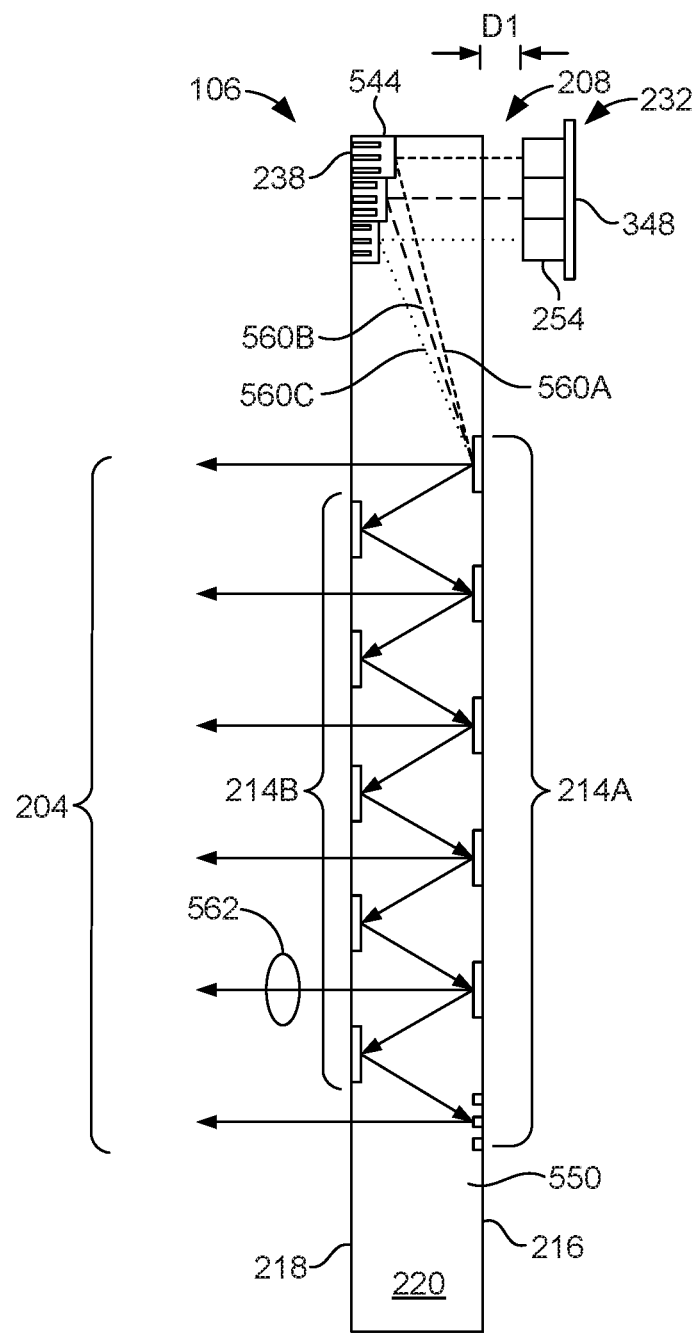
FIG. 5B illustrates a waveguide configuration of a display device that forms images and replications of images, in accordance with various embodiments.

As discussed in conjunction with at least FIGS. 2A and FIGS. 5A-5B, the source assembly 230 may project (scanned or non-scanned) image light on an image field through waveguide configuration 106, via one or more 1D and/or 2D arrays of light-emitting components (i.e., emitter arrays) included in light source 232. In scanning embodiments, a scanning mirror may be employed to scan the pre-waveguide image light 208 in such a manner to form scanned images on the image field. In some scanning embodiments, as well as non-scanning embodiments, the image emitted by emitter arrays included in light source 232 may be conditioned and/or magnified by optics system 234 and/or light conditioning assembly (e.g., one or more lenses) before the light is received by coupling element 238 and coupled to waveguide 220 or a screen. Such optics systems are discussed in conjunction with at least optics systems 234 of FIG. 2C.

Similar to FIGS. 1B and 2A, display device 200 may provide images for both eyes or for a single eye 110. For purposes of illustration, FIG. 2B shows the display device 200 associated with a single eye 110. Another display device (not shown), that is separated (or at least partially separated) from the display device 200, may provide image light to another eye of the user. In a partially separated system, one or more components may be shared between display devices for each eye.

The source assembly 230 may be an embodiment of (or at least be similar to) source assembly 230 of FIG. 2C. As such, the source assembly 230 generates pre-waveguide image light 208. The source assembly 230 includes a light source 232 and an optics system 234. The light source 232 is an optical component that generates pre-waveguide image light 208 using a plurality of light emitters arranged in a matrix, i.e., emitter arrays composing light-emitting components (LECs) or light emitters. Each light emitter may emit monochromatic light. The light source 232 generates pre-waveguide image light 208 including, but not restricted to, red (R) image light, blue (B) image light, green (G) image light, infra-red image light, or image light of any other wavelength. While RGB image light, LECs, and pixels are often discussed in this disclosure, embodiments described herein are not limited to using red, blue and green as primary colors. Other colors are also possible to be used as the primary colors of the display device 200. Also, a display device in accordance with an embodiment may use more than three primary colors. Light source 232 may be an embodiment of, or at least be similar to, one of light sources 300 of FIG. 3.

The optics system 234 performs a set of optical processes, including, but not restricted to, focusing, combining, conditioning, and scanning processes on the image light generated by the light source 232. In some embodiments, the optics system 234 includes a light conditioning assembly that conditions pre-waveguide image light 208. In scanning embodiments, optics system 234 may include a scanning mirror assembly, as described below in detail in conjunction with at least FIGS. 2C and 5A. The source assembly 230 generates and outputs pre-waveguide image light 208. Similar to display device of FIG. 2A, the pre-waveguide image light 208 is received by coupling element 238, as is coupled to, as well as transmitted by, the waveguide 220.

The waveguide 220 is an optical waveguide that outputs post-waveguide image light 204 to an eye 110 of a user. The waveguide 220 receives the pre-waveguide image light 208 at one or more coupling elements 238, and guides the received input image light to one or more decoupling elements 214B. The coupling element 238 may be, for example, a diffraction grating, a holographic grating, some other element that couples the pre-waveguide image light 208 into the waveguide 220, or some combination thereof. For example, in embodiments where the coupling element 238 is diffraction grating, the pitch of the diffraction grating is selected such that total (or at least near total) internal reflection occurs, and the pre-waveguide image light 208 propagates internally toward the decoupling element 214B. The pitch of the diffraction grating may be in the range of 300 nm to 600 nm.

The decoupling element 214B decouples and/or outputs the total (or near total) internally reflected image light from the waveguide 220. Thus, waveguide may be an output waveguide. The decoupling element 214B may be, for example, a diffraction grating, a holographic grating, some other element that decouples image light out of the waveguide 220, or some combination thereof. For example, in embodiments where the decoupling element 214B is a diffraction grating, the pitch of the diffraction grating is chosen to cause incident image light to exit the waveguide 220. In scanning embodiments, an orientation and position of the post-waveguide image light 204 exiting from the waveguide 220 may be controlled by changing an orientation and position of the pre-waveguide image light 208 entering the coupling element 238. The pitch of the diffraction grating may be in the range of 300 nm to 600 nm.

The waveguide 220 may be composed of one or more materials that facilitate total (or near total) internal reflection of the pre-waveguide image light 208. For example, the waveguide 220 may be composed of silicon, plastic, glass, or polymers, or some combination thereof. The waveguide 220 has a relatively small form factor. For example, the waveguide 220 may be approximately 50 mm wide along X-dimension, 30 mm long along Y-dimension and 0.5-1 mm thick along Z-dimension.

Similarly to controlling the operations of the embodiments of source assembly 230 of FIG. 2A, controller 202 may control the image rendering operations of the embodiment of source assembly 230 shown in FIG. 2B. The controller 202 determines instructions for the source assembly 230 based at least on the one or more display instructions. Display instructions are instructions to render one or more images. In some embodiments, display instructions may be an image file (e.g., bitmap). In another example, the display instructions may be received from a console of a augmented-reality (AR) system, a virtual-reality (VR) system, and/or a mixed-reality (MR) system, not shown in FIG. 2B. In scanning embodiments, display instructions may include scanning instructions that are used by the source assembly 230 to generate images via scanning pre-waveguide image light 208. For example, the scanning instructions may include a type of a source of image light (e.g., monochromatic, polychromatic), a scanning rate, an orientation of a scanning apparatus, one or more illumination parameters, or some combination thereof. The controller 202 includes a combination of hardware, software, and/or firmware not shown here so as not to obscure other aspects of the disclosure.

FIG. 2C illustrates a schematic block diagram of the source assembly 230 of FIGS. 2A-2B, in accordance with various embodiment. That is, source assembly 230 of FIG. 2C may be an embodiment of (or at least similar to) source assembly 230 of FIG. 2A and/or source assembly 230 of FIG. 2B. As such, source assembly 230 includes a light source 232 and an optics system 234. In some embodiments, source assembly 230 may be a scanning source assembly, while in other embodiments, source assembly 230 is a non-scanning source assembly. The various operations and/or functionalities of source assembly 230 may be controlled via executing instructions on a processor device and/or controller device. When the instructions are executed, the processor device and/or controller device may cause the performance of various actions and/or steps. The instructions may be stored on a non-transitory computer-readable storage medium.

Light source 232 includes a plurality of source elements, shown schematically as source elements 254A-254F. Source elements may include an array of light-emitting components (LECs), i.e., a source element may include and/or be an embodiment of an emitter array. Various embodiments of emitter arrays are discussed in conjunction with FIGS. 3-4. However, briefly here, an emitter array may be a 2D arrays of LECs, such as but not limited to light-emitting diodes (LEDs). As discussed below, the number, arrangement, and configuration of the plurality of source elements may vary based on whether the source assembly is a scanning source assembly, or a non-scanning source assembly.

Optics system 234 includes a light conditioning assembly 250. In scanning embodiments, in addition to light conditioning assembly 250, optics system 234 may include a scanning mirror assembly 252. In non-scanning embodiments of source assembly 230, the optics system 234 need not, but may, include scanning mirror assembly 252. Because the inclusion of scanning mirror assembly 252 is optional, depending upon whether source assembly 230 is a scanning or non-scanning embodiment, scanning mirror assembly 252 is indicated in FIG. 2C via a dashed box.

In non-scanning embodiments, light source 232 may include more source elements (e.g., emitter arrays), than in scanning embodiments. In non-scanning embodiments, there may exist a one-to-one mapping (or correspondence) between individual LECs included in the source elements and pixel regions of a display device, such as but not limited to pixel regions of display device 104 of FIGS. 1A-1B and/or display device 200 of FIGS. 2A-2B. In scanning embodiments, each LEC may be mapped to more than one pixel region of a display device. For example, a scanning mirror included in scanning mirror assembly 252 may be employed to scan light emitted by a single LEC to multiple pixels of the display device. Thus, via the scanning mirror assembly 252, a single LEC may illuminate multiple LECs, and thus less source elements may be required for scanning embodiments. For example, in a scanning embodiment of source assembly 230, light source 232 may include source elements 254A-254C, whereas in a non-scanning embodiment, light source 232 may include source elements 254A-254C, as well as source elements 254D-254F.

Because scanning embodiments may include less source elements, the source elements in a scanning embodiment may be referred to as a "1D" arrangement of source elements or emitter arrays. The source elements in a non-scanning embodiment may be referred to as a "2D" arrangement of source elements or emitter arrays. Note that even though the 1D and 2D nomenclatures are employed, each of the source elements (e.g., source element 254A) may include a 2D array of LECs. That is, in scanning embodiments that include source elements 254A-254C, but do not include source elements 254D-254F, the included source elements are said to be arranged in a 1D array, i.e., a 1D arrangement of 2D emitter arrays. In non-scanning embodiments that include source elements 254A-254F, the included source elements are said to be arranged in a 2D array, i.e., a 2D arrangement of 2D emitter arrays. It should also be noted that the 1D arrangement of source elements 254A-254C and the 2D arrangement of source elements 254A-254F are illustrative only, and the total number of, arrangements of, and configurations of source elements may vary from embodiment to embodiment. The source assembly 230 may generate light in accordance with scanning instructions from the controller 202.

The light source 232 is a source of light that generates image light. In some embodiments, the image light is collimated or at least partially collimated image light. In other embodiments, the image light need not be collimated. The light source 232 emits light in accordance with one or more illumination parameters received from the controller 202. As discussed above, the light source 232 includes one or more source elements 254A-254C, and/or source elements 254A-254F, either configuration which may be collectively referred to as source elements 254. Source elements may be comprised of light-emitting components (LECs), as discussed throughout.

The individual source elements 254 of an emitter array may include one or more compact, efficient and/or powerful sources of lights, e.g., LECs with at least ultra-high brightness, low power consumption, and a low footprint. The source elements 254 may include one or more arrays of light-emitting components (LECs), such as but not limited to light-emitting diodes (LEDs), e.g., µLEDs, organic LEDs (OLEDs), a superluminescent LED (SLED), and organic µLEDs. A µLED may be an LED with features sizes ranging between sub-microns to a hundreds of microns. Various embodiments of µLEDs are discussed in conjunction with FIGS. 6A-6B. In some embodiments, GaN-based inorganic LEDs can be made orders of magnitude brighter than OLEDs with a light emission area of few microns.

In one embodiment, the source elements 254 may be arranged in a concave curved fashion. For example, the source elements 254 may have a radius of curvature ranging from few millimeters to few centimeters depending on the display size and a length of few millimeters. An advantage of a curved array is that it is easier to form a compact lens to have high quality image on curved surface without correcting the field of curvature of the lens. In alternate embodiments, the source elements 254 may be arranged in a flat and/or linear fashion.

The source element 254 emits a source light 244 to the optics system 234. In some embodiments, the source light 244 may emit one or more colors (e.g. red, green, and blue). For example, the source element 254A may emit red source light, the source element 254B may emit blue source light, and the source element 254C may emit green source light. In non-scanning embodiments that additionally include source elements 254D-254F, the source element 254AD may emit red source light, the source element 254E may emit blue source light, and the source element 254F may emit green source light. Additionally, in some embodiments, one or more of the source elements may emit light in the infrared, or light of other non-visible wavelengths.

The optics system 234 may include a light conditioning assembly 250 and a scanning mirror assembly 252. The light conditioning assembly 250 conditions the source light 244 and emits conditioned light 248. In embodiments that include scanning mirror assembly 252, the conditioned light is provided to the scanning mirror assembly 252. In scanning embodiments, light condition assembly 250 may condition source light 244 for incidence on scanning mirror assembly 252. In non-scanning embodiments, light condition assembly 250 may condition source light 244 for being received by a waveguide configuration, such as but not limited to waveguide configuration of FIGS. 1B and FIGS. 2A-2B. The light conditioning assembly 250 includes one or more optical components that condition the light from the light source 232. Conditioning light from the light source 232 may include, for example, expanding, collimating, correcting for one or more optical errors (e.g., field curvature, chromatic aberration, etc.), some other adjustment of the light, or some combination thereof. The light conditioning assembly 250 conditions the source light 244 and emits conditioned light 248. In non-scanning embodiments, conditioned light 248 may be outputted as pre-waveguide image light 208. In scanning embodiments, the conditioned light 248 may be received by scanning mirror assembly 252, and scanned and/or further conditioned light may be outputted as pre-waveguide image light 208.

The scanning mirror assembly 252 includes one or more optical elements that redirect image light via one or more reflective portions of the scanning mirror assembly 252. Where the image light is redirected towards is dependent upon specific orientations of the one or more reflective portions. In some embodiments, the scanning mirror assembly 252 includes a single scanning mirror that is configured to scan in at least two dimensions. In other embodiments, the scanning mirror assembly 252 may include a plurality of scanning mirrors that each scan in orthogonal directions to each other. The scanning mirror assembly 252 may raster scan (horizontally, or vertically). In some embodiments, the scanning mirror assembly 252 may perform a controlled vibration along the horizontal and/or vertical directions with a specific frequency of oscillation to scan along two dimensions and generate a two-dimensional projected line image of the media presented to user's eyes. For example, the scanning mirror assembly 252 may undergo an oscillation with peak-to-peak amplitude of few hundreds of nanometers per second along the vertical direction based on the desired frequency of oscillation. The scanning mirror assembly 252 emits a pre-waveguide image light 208 based on the conditioned light 248. The scanning mirror assembly 252 outputs the pre-waveguide image light 208 at a particular orientation (in accordance with the scanning instructions) and towards a waveguide configuration.

In some embodiments, the scanning mirror assembly 252 includes a galvanometer mirror. For example, the galvanometer mirror may represent any electromechanical instrument that indicates that it has sensed an electric current by deflecting a beam of image light with one or more mirrors. The galvanometer mirror may be configured to scan in at least one orthogonal dimension to generate the scanned pre-waveguide image light 208. The pre-waveguide image light 208 from the galvanometer mirror represents a two-dimensional line image of the media presented to user's eyes. As noted above, in non-scanning embodiments, source assembly 230 need not include scanning mirror assembly 252.

The controller 202 controls the light source 232 and/or the scanning mirror assembly 252. The controller 202 takes content for display, and divides the content into discrete sections. The controller 202 instructs the light source 232 to sequentially present the discrete sections. In scanning embodiments, the controller 202 instructs the scanning mirror assembly 252 to scan the presented discrete sections to different areas of a coupling element 238 of the waveguide 220. Accordingly, when scanned light 238 exits the waveguide 220, separate portions of scanned light 238 are presented in different locations of the coupling element 238. While each discrete section is presented at different times, the presentation and scanning of the discrete sections occurs fast enough such that a user's eye integrates the different sections into a single image or series of images. In non-scanning embodiments, the controller 202 instructs the light source 232 to present different areas of the coupling element 238 of the waveguide 220 into different discrete sections.

For example, in scanning embodiments, controller 202 segments the content into scan lines, via scanning instructions. The scan lines are scanned out to different areas of the coupling element 238 of the waveguide 220. When scanned pre-waveguide image light 208 exits the waveguide 220, each of the lines are presented at a different location, as post-waveguide image light 204, which a user's eye integrates into a single 2D image or series of 2D images.

For example, the scanning instructions may cause the source assembly 230 to scan out an image in accordance with a scan pattern (e.g., raster, interlaced, etc.). The scanning instructions control an intensity of light emitted from the light source 232, and the optics system 234 scans out the image by rapidly adjusting orientation of the emitted light. If scanned at a sufficient frequency, a human eye integrates the scanned pattern into a single 2D image. In non-scanning embodiments, the source assembly 230 may similarly generate 2D images without the need for a scan pattern because the light source 232 includes one or more LECs for each pixel of the display device. For example, based on display instructions, controller 202 may operate individual LECs included in source elements 254A-254F to illuminate pixels corresponding the 2D images.

Figure 3:
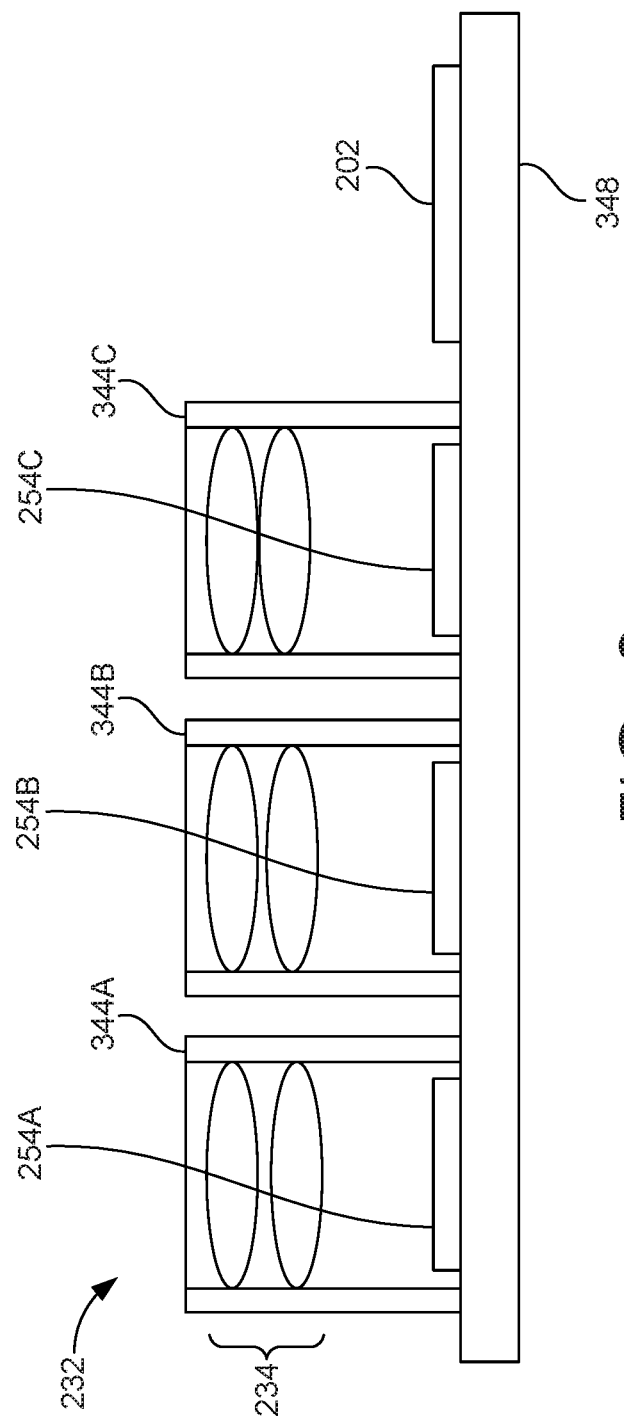
FIG. 3 illustrates a cross-sectional view of an embodiment of a light source included in the display device of FIGS. 2A-2C, in accordance with the various embodiments.

FIG. 3 illustrates a cross-sectional view of an embodiment of light source 232 included in the display device of FIGS. 2A-2C, in accordance with the various embodiments. As shown in FIG. 3, one embodiment of a light source 232 may include a first source element 254A, a second source element 254B, and a third emitter array 254C. As used herein, the terms source element and emitter array may be used interchangeably. Each of the emitter arrays 254A, 254B, and 254C may be disposed in an array housing 344A, 344B, and 344C, respectively. For convenience, the emitter arrays 254A-254C may be referred to collectively as emitter arrays 254, and also individually as emitter array 254. Similarly, the array housings 344A-344C may be referred to collectively as array housings 344, or individually as array housing 344. As discussed in conjunction with at least FIG. 2C, each of the emitter arrays 254 may include a 2D array of light-emitting components (e.g., LEDs). FIG. 3 illustrates a 1D arrangement of emitter arrays for a scanning embodiment. However, as discussed in conjunction with at least FIG. 2C, a 2D arrangement of emitter arrays may be employed for non-scanning embodiments.

Each of the array housings 344 may include an optics system 234, which may include one or more optical components, such as lenses (e.g., glass, plastic, or meta-material lenses), prisms, filters, scanning mirrors, and the like. As discussed in conjunction with FIG. 2C, optics system 234 may include a light conditioning assembly. In scanning embodiments, optics system 234 may additionally include a scanning mirror assembly, such as but not limited to scanning mirror assembly 252 of FIG. 2C. In other embodiments, the optics system 234 is not housed within housings 344. Each of the source elements 254A-254C may include a separate and/or distinct optics system.

As discussed in conjunction with at least FIG. 2C, the optics system 234 may condition and/or alter the direction or control other characteristics of source light 244 emitted by emitter arrays 254. As shown in FIG. 3, the emitter arrays 254 may be secured to a common structure, such as a backplane 348 or printed circuit board (PCB). The backplane 348 may include a logic device, such as but not limited to an ASIC, processor, FPGA, controller 202, or the like. Backplane 348 may include electrical contacts (e.g., leads) that electrically couple individual LECs of the emitter arrays 254 to controller 202. In other embodiments, the controller 202 may be disposed elsewhere on the HMD 100 of FIGS. 1A-1B, secured either directly or indirectly to the frame 102 of FIG. 1A.

Each of the emitter arrays 254 may be a monochromatic emitter array having a 1D or 2D configuration of individual emitters (e.g., LEDs) of a single color. As described herein, a green colored light may be understood as light composed of photons with a range of wavelengths between about 500 nanometers (nm) to about 555 nm. Furthermore, as described herein, red colored light may be understood as light composed of photons with a range of wavelengths between about 622 nm to about 780 nm. Blue colored light may be understood as light composed of photons with a range of wavelengths between about 440 nm to about 492 nm. A monochromatic emitter array 254 may emit light within a narrow wavelength range, rather than a single wavelength, in some embodiments. For example, a monochromatic emitter array 254 may emit colored light (e.g., red, green, or blue photons) within a narrow wavelength range of 5-10 nm in width.

One or more chromatic filters, which may facilitate a simplified projection lens design with reduced achromatic performance requirements, may be employed to further narrow the wavelength range of an emitter array. In some embodiments, the emitter array 254A may include only red light-emitting components, the emitter array 254B may include only green light-emitting components, and the emitter array 254C may include only blue light-emitting components. Under the direction of controller 202, each of the emitter arrays 254A-254C may produce a monochromatic 2D image according to the color produced by its respective emitters. Accordingly, the three monochromatic emitter arrays 254A-254C may simultaneously emit three monochromatic images (e.g., a red image, a green image, and a blue image composed of image light) towards optics system 234.

As discussed elsewhere, the three monochromatic images may be interposed, composited, or otherwise combined to generate a full color image. For example, the controller 202 may receive a full-color image to be displayed to a user and then decompose the full-color image into multiple monochromatic images, such as a red image, a green image, and a blue image. That is, the full-color image may be separated, or otherwise decomposed into three monochromatic images of primary colors. As described herein, the waveguide configuration 106 of FIG. 1B and FIGS. 2A-2B may combine (or recombine) the three monochromatic images to produce a full-color image or a poly-chromatic (or multi-chromatic) image, via post-waveguide image light 204 and directed toward the eye 110 of FIG. 1B and FIGS. 2A-2B. In yet other examples, one or more emitter arrays 254A-254C may produce light of multiple wavelengths, ranges of wavelengths, or other forms of light other than monochromatic light.

In some embodiments, a calibration and/or alignment system (not shown in FIG. 3) may be employed to align the multiple monochromatic images (e.g., via mechanical movement, or scanning, of one or more of the monochromatic emitter arrays 254A-254C or movement of the one or more of the monochromatic images by one or more pixels as emitted from their associated monochromatic emitters 254A-254C) to produce a desired or intended, properly aligned multi-chromatic image.

Figure 4:
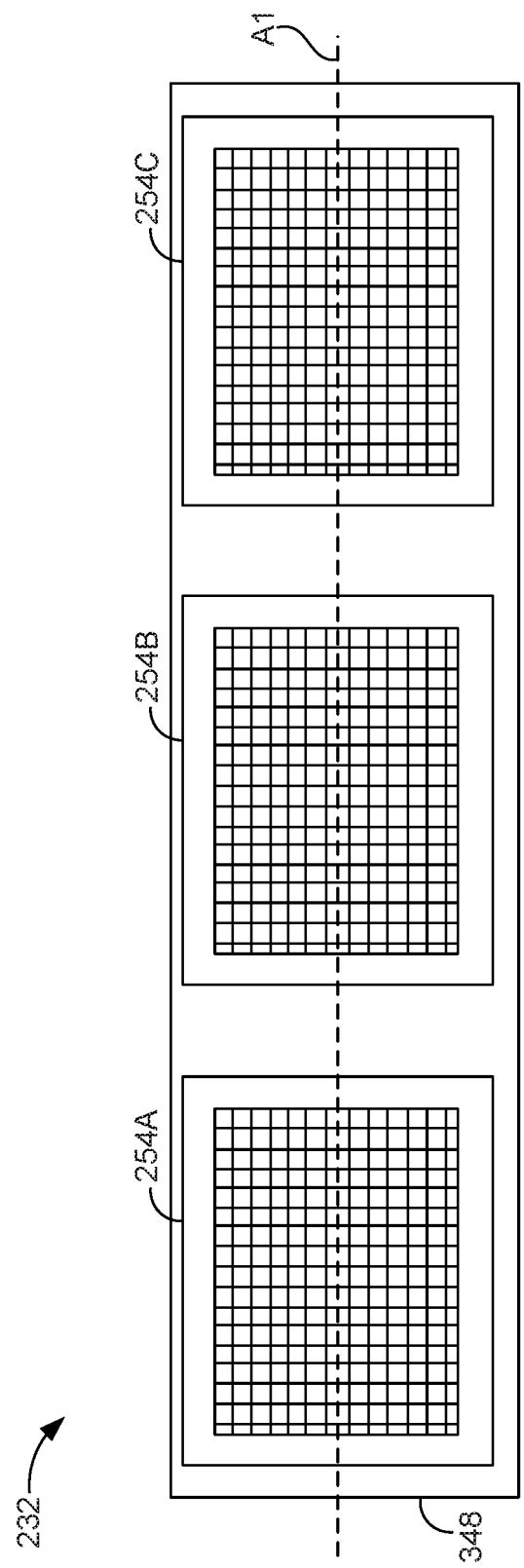
FIG. 4 shows a top view of a light source that includes a 1D configuration of emitter arrays, according to some embodiments.

FIG. 4 shows a top view of light source 232 that includes a 1D configuration of emitter arrays 254A-254C, according to some embodiments. The 1D configuration shown in FIG. 4 is a linear configuration of 2D emitter arrays 254A-254C along the A1 axis. In the embodiment of FIG. 4, the individual emitter arrays 254A-254C have an aspect ratio greater than 1.0 (i.e., emitter arrays 254 are rectangular 2D arrays of LECs). However, in other embodiments, the aspect ratio of the emitter arrays 254A-254C may be equal to 1.0 (i.e., emitter arrays 254 are square 2D arrays of LECs). The particular linear configuration may be arranged according to a longer side of the rectangular arrays 254A-254C. While the emitter arrays 254A-254C may have a 1D configuration of the emitters (e.g., LEDs) in some scanning embodiments, in other non-scanning embodiments, the emitter arrays 254 may be arranged in a (square or rectangular) 2D configuration. In yet other embodiments, the emitter arrays 254A-254C may have other non-linear configurations (e.g., oval, circular, or otherwise round in some fashion) while defining a first dimension (e.g., a width) and a second dimension (e.g., a length) that is orthogonal to the first direction, with one dimension being equal or unequal to each other. The emitters included in emitter arrays 254A-254C may have a 2D emitter array configuration with more than 1000×1000 emitters. In some embodiments, the emitter arrays 254A-254C may be 1D emitter arrays, rather than 2D emitter arrays, as shown in FIG. 4. Various other combinations are also within the scope of the present disclosure. Emitter arrays 254A-254C may be bonded and/or electrically coupled to backplane 348.

Formation of an Image

Figure 5C:
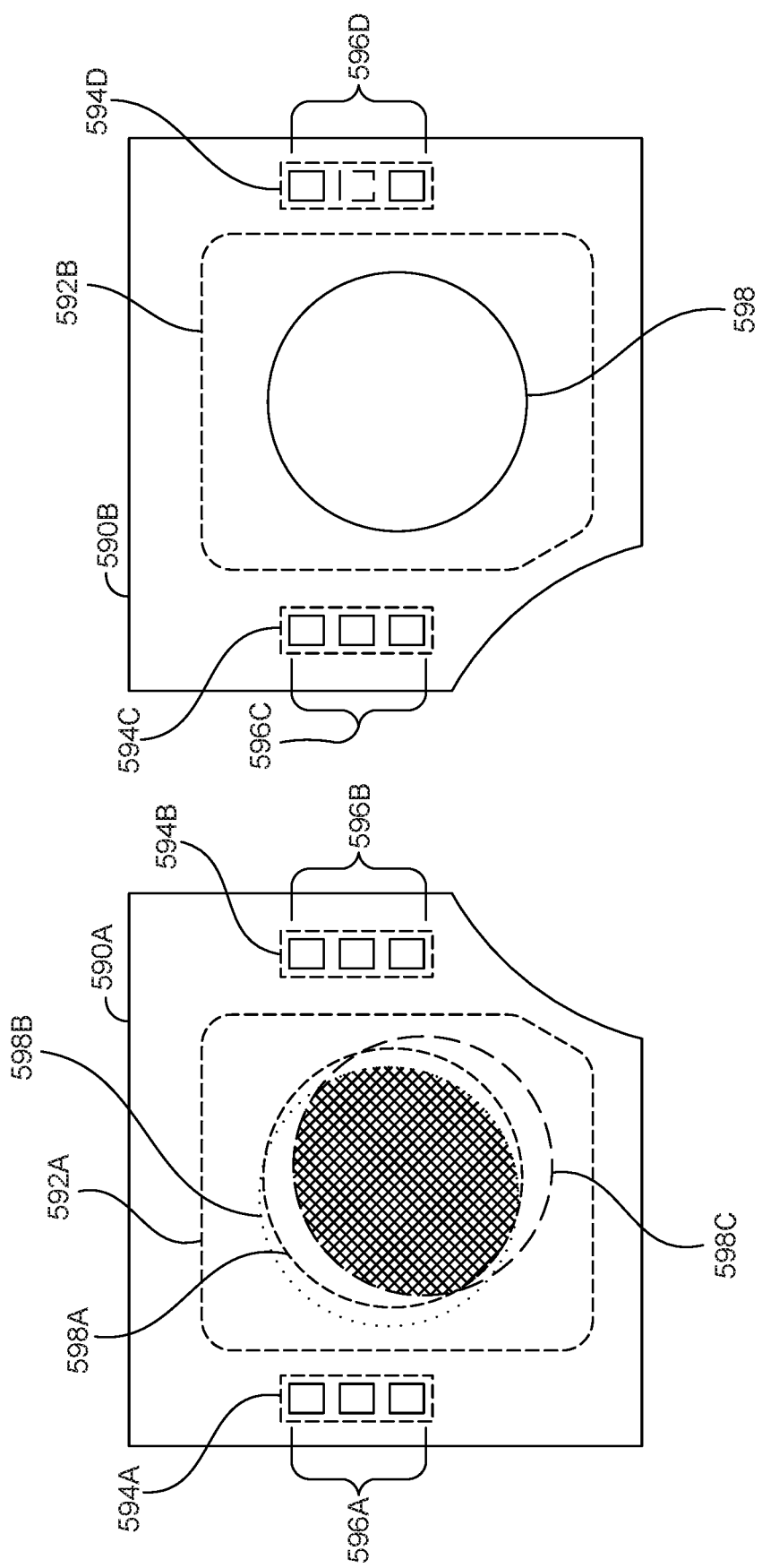
FIG. 5C is a top view of a display device, in accordance with some embodiments.

FIGS. 5A-5C illustrate how images and pupil replications are formed in display device 200 based on different structural arrangement of light emitters, in accordance with different embodiments. An image field 530 of coupling element 238 is an area of coupling element 238 that receives the pre-waveguide image light 208, emitted by the light source 232 and forms an image on the coupling element 238, which is transmitted via waveguide 220. For example, an image field 530 may correspond to a portion of the coupling element 238. Note that decoupling element 214B of FIGS. 2A-2B also includes an image field that outputs the post-waveguide image light 204 to the eye 110 of the user. In some cases, an image field is not an actual physical structure but is an area to which the pre-waveguide or post-waveguide image light is projected and which the image is formed. In one embodiment, the image field is a surface of the coupling element 238 of FIGS. 2A-2B and the image formed on the image field is magnified as light travels through the waveguide 220 of FIGS. 2A-2B. In another embodiment, an image field is formed after light passing through the waveguide, which combines the light of different colors to form the image field. In some embodiments, the image field may be projected directly into the user's eyes.

FIG. 5A is a diagram illustrating a scanning operation of a scanning embodiment of display device 200, in accordance with an embodiment. Display device 200 of FIG. 5A may be a scanning embodiment of display device 104 of FIGS. 1A-1B and/or a scanning embodiment of display device 200 of FIGS. 2A-2B, or a scanning embodiment of any other display device discussed herein. As discussed in conjunction with at least FIGS. 2A-2C, display device 200 may include source assembly 230 and a waveguide configuration that includes waveguide 220 and coupling element 238. Coupling element 238 includes an image field 520, of length L2. The image field 520 may include a 2D array of pixel locations 532, represented by the blocks in inset 534. The 2D array of pixel locations 532 may include p rows, indexed via row 1 through row p. The source assembly 230 includes a light source 232 and a light condition assembly 250. Because display device 200 of FIG. 5A is a scanning display device, the source assembly of FIG. 5A additionally includes a scanning mirror assembly 252, which includes mirror 520, which is a scanning mirror.

As discussed throughout, the light source 232 includes a 1D configuration of emitter arrays (or source elements) 254. That is, light source 232 includes multiple rows and columns of light-emitting components (LECs) that are included in one or more 2D emitter arrays 254. Individual LECs included in emitter array 254 are represented by the dots in inset 515. Thus, in some embodiments, emitter arrays may be comprised of one or more arrays of LECs, such as but not limited to light-emitting diodes (LEDs). Various embodiments of emitter arrays are discussed in conjunction with at least FIGS. 3-4. Various non-limiting embodiments of LEDs are discussed in conjunction with at least FIGS. 6A-6B.

In some embodiments, scanning light source 232 may include a 1D configuration of emitter arrays, wherein a separate emitter array 254 of the 1D configuration is dedicated to each primary color of the 2D images to the presented. In various embodiments, the light source 232 may include more than one emitter array 254 for each primary color. Light source 232 may emit source light 244 as a set of collimated beams of light. For example, FIG. 5A shows multiple beams of source light 244 that are emitted by one or more columns of LECs included in emitter array 254. As discussed in conjunction with at least FIGS. 2A-2C, light conditioning assembly 250 may condition source light 244 and transmit resulting conditioned light 248 to scanning mirror assembly 252.

Conditioned light 248 irradiates scanning mirror 520 of scanning mirror assembly 252. The mirror 520 reflects, scans, and projects pre-waveguide image light 208. The mirror 520 may rotate about an axis 522. The mirror 520 may be a microelectromechanical system (MEMS) mirror or any other suitable mirror. As the mirror 520 rotates about rotational axis 522, the pre-waveguide image light 208 is directed to a different part of the image field 530 of coupling element 238, as illustrated by the reflected part of the pre-waveguide image light 208 in solid lines and the reflected part of the pre-waveguide image light 208 in dash lines.

At a particular orientation of the mirror 520 (i.e., a particular rotational angle), the emitter arrays 254 illuminate a portion of the image field 530 (e.g., a particular subset of multiple pixel locations 532 on the image field 530). In one embodiment, the LECs of emitter arrays 254 are arranged and spaced such that a light beam from each emitter array 254 is projected on a corresponding pixel location 532. In another embodiment, small light emitters such as μLEDs are used for emitter arrays 254 so that light beams from a subset of multiple light emitters are together projected at the same pixel location 532. In other words, a subset of multiple emitter arrays 254 collectively illuminates a single pixel location 532 at a time.

The image field 530 may also be referred to as a scan field because, when the pre-waveguide image light 208 is projected to an area of the image field 530, the area of the image field 530 is being illuminated by the pre-waveguide image light 208. The image field 530 may be spatially defined by a matrix of pixel locations 532 (represented by the blocks in inset 534) in rows and columns. A pixel location here refers to a single pixel. The pixel locations 532 (or simply the pixels) in the image field 530 sometimes may not actually be additional physical structure. Instead, the pixel locations 532 may be spatial regions that divide the image field 530. Also, the sizes and locations of the pixel locations 532 may depend on the projection of the pre-waveguide image light 208 from the source assembly 230. For example, at a given angle of rotation of the mirror 520, light beams emitted from the light source 232 may fall on an area of the image field 530. As such, the sizes and locations of pixel locations 532 of the image field 530 may be defined based on the location of each light beam.

In some embodiments, a pixel location 532 may be subdivided spatially into subpixels (not shown). For example, a pixel location 532 may include a red subpixel, a green subpixel, and a blue subpixel. The red subpixel corresponds to a location at which one or more red light beams are projected, etc. When subpixels are present, the color of a pixel 532 is based on the temporal and/or spatial average of the subpixels.

The number of rows and columns of emitter arrays 254 of the light source 232 may or may not be the same as the number of rows and columns of the pixel locations 532 in the image field 530. In various 1D configurations of emitter arrays 254, the number of emitter arrays 254 in a row is equal to the number of pixel locations 532 in a row of the image field 530 while the number of emitter arrays 254 in a column is two or more, but fewer than the number of pixel locations 532 in a column of the image field 530.

In other 1D configurations of emitter arrays 254, the configuration of emitter arrays 254 of light source 232 has the same number of columns of emitter arrays 254 as the number of columns of pixel locations 532 in the image field 530, but has fewer rows than the image field 530. For example, in one specific embodiment, the light source 232 has approximately 1280 columns of emitter arrays 254, which is the same as the number of columns of pixel locations 532 of the image field 530. The light source 232 may have a first length L1, which is measured from the first row to the last row of emitter arrays 254. The image field 530 has a second length L2, which is measured from row 1 to row p of the scan field 530. In one embodiment, L2 is greater than L1 (e.g., L2 is 50 to 10,000 times greater than L1).

As noted, scanning embodiments of display device 200 include a 1D configuration of emitter arrays 254, where the number of rows of pixel locations 532 is larger than the number of rows of emitter arrays 254. In some embodiments, the display device 200 may employ the mirror 520 to project the light 502 to different rows of pixels at different times. As the scanning mirror 520 rotates and the pre-waveguide image light 208 scans through the image field 530 quickly, a scanned image is formed on the image field 530. In some embodiments, the light source 232 may have a smaller number of columns than the image field 530. The mirror 520 may rotate in two dimensions to fill the image field 530 with light (e.g., a raster-type scanning down rows then moving to new columns in the image field 530).

The display device 200 may operate in predefined display periods. A display period may correspond to a duration of time in which an image is formed. For example, a display period may be associated with the frame rate (e.g., a reciprocal of the frame rate). In the particular scanning embodiment shown in FIG. 5A, scanning mirror 520 mirror rotates as a particular rotational frequency, and the display period is as a scanning period that is dependent upon the rotational frequency of mirror 520. A complete cycle of rotation of the mirror 520 may correspond to the scanning period. A scanning period herein refers to a predetermined cycle time during which the entire image field 530 is completely scanned. The scanning of the image field 530 is controlled by the mirror 520.

The light generation of the display device 200 may be synchronized with the rotation of the mirror 520. For example, in one embodiment, the rotational movement of the mirror 520 from an initial position that projects light to row 1 of the image field 530, to the last position that projects light to row p of the image field 530, and then back to the initial position is equal to a scanning period. The scanning period may also be related to the frame rate of the display device 200. By completing a scanning period, an image (e.g., a frame) is formed on the image field 530 per scanning period. Hence, the frame rate may correspond to the number of scanning periods in a second.

As the mirror 520 rotates, light scans through the image field and images are formed. The actual color value and light intensity (brightness) of a given pixel location 532 may be an average of the color various light beams illuminating the pixel location during the scanning period. After completing a scanning period, the mirror 520 rotates back to the initial position to project light onto the first few rows of the image field 530 again, except that a new set of driving signals may be fed to the emitter arrays 254. The same process may be repeated as the scanning mirror 520 rotates in cycles. As such, additional images are formed in the scanning field 530 in different frames.

FIG. 5B illustrates a waveguide configuration 106 of a display device that forms images and replications of images, in accordance with various embodiments. Replications of images may be referred to as pupil replications. Waveguide configuration 106 may be employed in the scanning embodiments, as well as the non-scanning embodiments discussed herein. Waveguide configuration includes light source 232 and waveguide 220. Light source 232 may be included in a source assembly, such as but not limited to source assembly 230 of FIGS. 2B-2C and FIG. 5A. Thus, in scanning embodiments, light source 232 in a scanning light source, and in non-scanning embodiments, light source 232 is a non-scanning light source. As such, the light source 232 may comprise three separate emitter arrays 254, as described in conjunction with at least FIGS. 3-4. The primary colors of emitter arrays 254 may be red, green, and blue, or another combination of other suitable primary colors. The various operations and/or functionalities of waveguide configuration 106 may be controlled via executing instructions on a processor device and/or controller device. When the instructions are executed, the processor device and/or controller device may cause the performance of various actions and/or steps. The instructions may be stored on a non-transitory computer-readable storage medium.

In non-scanning embodiments, the number of light emitters (e.g., individual LECs) in emitter arrays 254 may be equal to the number of pixel locations within an image field (not shown in FIG. 5B). As such, each LEC included in emitter array 254 of a non-scanning embodiment may be dedicated to generating images at a particular pixel location of the image field. In scanning embodiments, the number of light emitters in emitter arrays 254 may be less than the number of pixel locations within the image field. Thus, in scanning embodiments, each LEC included in emitter array 254 may be dedicated to generating images at multiple pixel locations of the image field. In still other embodiments, scanning and non-scanning configurations may be combined to generate multiple pupil replications.

Thus, the embodiments depicted in FIG. 5B may provide for the projection of many image replications (e.g., pupil replications) or decoupling a single image projection at a single point. Accordingly, additional embodiments of disclosed NEDs may provide for a single decoupling element. Outputting a single image toward the eye-box 108 of FIG. 1B may preserve the intensity of the coupled image light. Some embodiments that provide for decoupling at a single point may further provide for steering of the output image light. Such pupil-steering NEDs may further include systems for eye tracking to monitor a user's gaze. Some embodiments of the waveguide configuration 106 that provide for pupil replication, as described herein, may provide for one-dimensional replication, while other embodiments may provide for two-dimensional replication. For simplicity, FIG. 5B illustrates one-dimensional pupil replication. Two-dimensional pupil replication may include directing light into and outside the plane of FIG. 5B. FIG. 5B is presented in a simplified format. The detected gaze of the user may be used to adjust the position and/or orientation of the emitter arrays 254 individually or the light source 232 as a whole and/or to adjust the position and/or orientation of the waveguide configuration.

The waveguide configuration 106 is disposed in cooperation with a light source 232, which may include one or more monochromatic or polychromatic emitter arrays 254 secured, bonded, and/or electrically coupled to a support structure 348 (e.g., a printed circuit board, a backplane, or another structure). The support structure 348 may be coupled to the frame 102 of FIG. 1A. The waveguide configuration 106 may be separated from the light source 232 by an air gap having a distance D1. The distance D1 may be in a range from approximately 50 µm to approximately 500 µm in some examples. The monochromatic or polychromatic images or images projected from the light source 232 (as pre-waveguide image light 208) may pass through the air gap toward the waveguide configuration 106. Any of the light source embodiments described herein may be utilized as the light source 232.

The waveguide 220 may be formed from a glass or plastic material. The waveguide 220 may include a coupling area 544 (which includes coupling elements 238) and a decoupling area formed by decoupling elements 214A on a top surface 216 and decoupling elements 214B on a bottom surface 218 in some embodiments. The area within the waveguide 220 in between the decoupling elements 214A and 214B may be considered a propagation area 550, in which light images (formed by pre-waveguide image light 208) received from the light source 232 and coupled into the waveguide 220 by coupling elements 238 included in the coupling area 544 may propagate laterally within the waveguide 220.

The coupling area 544 may include coupling elements 238 configured and dimensioned to couple light of a predetermined wavelength, e.g., red, green, or blue light. When a white light emitter array is included in the light source 232, the portion of the white light that falls in the predetermined wavelength may be coupled by each of the coupling elements 238. In some embodiments, the coupling elements 238 may be gratings, such as Bragg gratings, dimensioned to couple a predetermined wavelength of light. In some examples, the gratings of each coupling element 238 may exhibit a separation distance between gratings associated with the predetermined wavelength of light that the particular coupling element 238 is to couple into the waveguide 220, resulting in different grating separation distances for each coupling element 238. Accordingly, each coupling element 238 may couple a limited portion of the white light from the white light emitter array when included. In other examples, the grating separation distance may be the same for each coupling element 238. In some examples, coupling element 238 may be or include a multiplexed coupler.

As shown in FIG. 5B, pre-waveguide image light 208 may include a red image 560A, a blue image 560B, and a green image 560C. The images 560A-560C may be coupled by the coupling elements 238 of the coupling area 544 into the propagation area 550 and may begin traversing laterally within the waveguide 220. In one embodiment, the red image 560A, the blue image 560B, and the green image 560C, each represented by a different dash line in FIG. 5B, may converge to form an overall image that is represented by a solid line. For simplicity, FIG. 5B may show an image by a single arrow, but each arrow may represent an image field where the image is formed. In another embodiment, red image 560A, the blue image 560B, and the green image 560C, may correspond to different spatial locations.

A portion of the light may be projected out of the waveguide 220 (e.g., post-waveguide light 204) after the light contacts the decoupling element 214A for one-dimensional pupil replication, and after the light contacts both the decoupling element 214A and the decoupling element 214B for two-dimensional pupil replication. In two-dimensional pupil replication embodiments, the light may be projected out of the waveguide 220 at locations where the pattern of the decoupling element 214A intersects the pattern of the decoupling element 214B.

The portion of light that is not projected out of the waveguide 220 by the decoupling element 214A may be internally reflected off the decoupling element 214B. The decoupling element 214B may reflect all (or near-all) incident light back toward the decoupling element 214A, as depicted. Accordingly, the waveguide 220 may combine the red image 560A, the blue image 560B, and the green image 560C into a polychromatic image instance, which may be referred to as a pupil replication 562. The polychromatic pupil replication 562 may be projected toward the eye-box 108 of FIG. 1B and to the eye 110, which may interpret the pupil replication 562 as a full-color image (e.g., an image including colors in addition to red, green, and blue). Pupil replication 562 may include at least a portion of the post-waveguide image light 204. The waveguide 220 may produce tens or hundreds of pupil replications 562 or may produce a single replication 562.

In some embodiments, the waveguide configuration 106 may differ from the configuration illustrated in FIG. 5B. For example, the coupling area 544 may be different. Rather than including gratings as coupling element 238, an alternate embodiment may include a prism that reflects and refracts received image light, directing it toward the decoupling element 214A. Also, while FIG. 5B generally shows the light source 232 having multiple emitter arrays 254 coupled to the same support structure 348, other embodiments may employ a light source 232 with separate monochromatic emitter arrays 254 located at disparate locations about the waveguide configuration (e.g., one or more emitter arrays 254 located near a top surface of the waveguide configuration and one or more emitter arrays 254 located near a bottom surface of the waveguide configuration).

Also, although only three emitter arrays are shown in FIG. 5B (e.g., a scanning 1D configuration of emitter arrays), an embodiment may include more or fewer emitter arrays. For example, in one embodiment, a display device may include two red emitter arrays, two green emitter arrays, and two blue emitter arrays (e.g., a non-scanning 2D configuration of emitter arrays). In one case, the extra set of emitter panels provides redundant light emitters for the same pixel location. In another case, one set of red, green, and blue panels is responsible for generating light corresponding to the most significant bits of a color dataset for a pixel location while another set of panels is responsible for generating light corresponding the least significant bits of the color dataset.

FIG. 5C is a top view of a display system (e.g., an NED), in accordance with an embodiment. The NED may include a pair of waveguide configurations. The included waveguide configuration may be an embodiment of, or at least similar to, at least one of waveguide configuration 106 of FIG. 1B, the waveguide configuration of FIG. 2A, and/or waveguide configuration 106 of FIG. 5B. Each waveguide configuration projects images to an eye of a user. In some embodiments not shown in FIG. 5C, a single waveguide configuration that is sufficiently wide to project images to both eyes may be used.

The waveguide configurations 590A and 590B may each include a decoupling area 592A or 592B. In order to provide images to an eye of the user through the waveguide configuration 590, multiple coupling areas 594 may be provided in a top surface of the waveguide of the waveguide configuration 590. The coupling areas 594A and 594B may include multiple coupling elements to interface with light images provided by an emitter array set 596A and an emitter array set 596B, respectively. Each of the emitter array sets 596 may include a plurality of monochromatic light emitter arrays, as described herein. As shown, the emitter array sets 596 may each include a red emitter array, a green emitter array, and a blue emitter array. As described herein, some emitter array sets may further include a white emitter array or an emitter array emitting some other color or combination of colors.

The right eye waveguide 590A may include one or more coupling areas 594A, 594B, 594C, and 594D (all or a portion of which may be referred to collectively as coupling areas 594) and a corresponding number of emitter array sets 596A, 596B, 596C, and 596D (all or a portion of which may be referred to collectively as the light emitter array sets 596). Accordingly, while the depicted embodiment of the right eye waveguide 590A may include two coupling areas 594 and two emitter array sets 596, other embodiments may include more or fewer. In some embodiments, the individual emitter arrays of an emitter array set may be disposed at different locations around a decoupling area. For example, the emitter array set 596A may include a red emitter array disposed along a left side of the decoupling area 592A, a green emitter array disposed along the top side of the decoupling area 592A, and a blue emitter array disposed along the right side of the decoupling area 592A. Accordingly, emitter arrays of an emitter array set may be disposed all together, in pairs, or individually, relative to a decoupling area.

The left eye waveguide 590B may include the same number and configuration of coupling areas 594 and LED sets 596 as the right eye waveguide 590A, in some embodiments. In other embodiments, the left eye waveguide 590B and the right eye waveguide 590A may include different numbers and configurations (e.g., positions and orientations) of coupling areas 594 and emitter array sets 596. Included in the depiction of the left waveguide 590A and the right waveguide 590B are different possible arrangements of pupil replication areas of the individual emitter arrays included in one emitter array set 596. In one embodiment, the pupil replication areas formed from different color emitter arrays may occupy different areas, as shown in the left waveguide 590A. For example, a red emitter array of the emitter array set 596 may produce pupil replications of a red image within the limited area 598A. A green emitter array may produce pupil replications of a green image within the limited area 598B. A blue emitter array may produce pupil replications of a blue image within the limited area 598C. Because the limited areas 598 may be different from one monochromatic emitter array to another, only the overlapping portions of the limited areas 598 may be able to provide full-color pupil replication, projected toward the eye-box 108. In another embodiment, the pupil replication areas formed from different color emitter arrays may occupy the same space, as represented by a single solid-lined circle 598 in the right waveguide 590B.

In one embodiment, waveguide portions 590A and 590B may be connected by a bridge waveguide (not shown). The bridge waveguide may permit light from the emitter array set 596A to propagate from the waveguide portion 590A into the waveguide portion 590B. Similarly, the bridge waveguide may permit light emitted from the emitter array set 596B to propagate from the waveguide portion 590B into the waveguide portion 590A. In some embodiments, the bridge waveguide portion may not include any decoupling elements, such that all light totally internally reflects within the waveguide portion. In other embodiments, the bridge waveguide portion 590C may include a decoupling area. In some embodiments, the bridge waveguide may be used to obtain light from both waveguide portions 590A and 590B and couple the obtained light to a detection (e.g. a photo-detector), such as to detect image misalignment between the waveguide portions 590A and 590B.

Structure of a Light-Emitting Diode (LED)

Figure 6A:
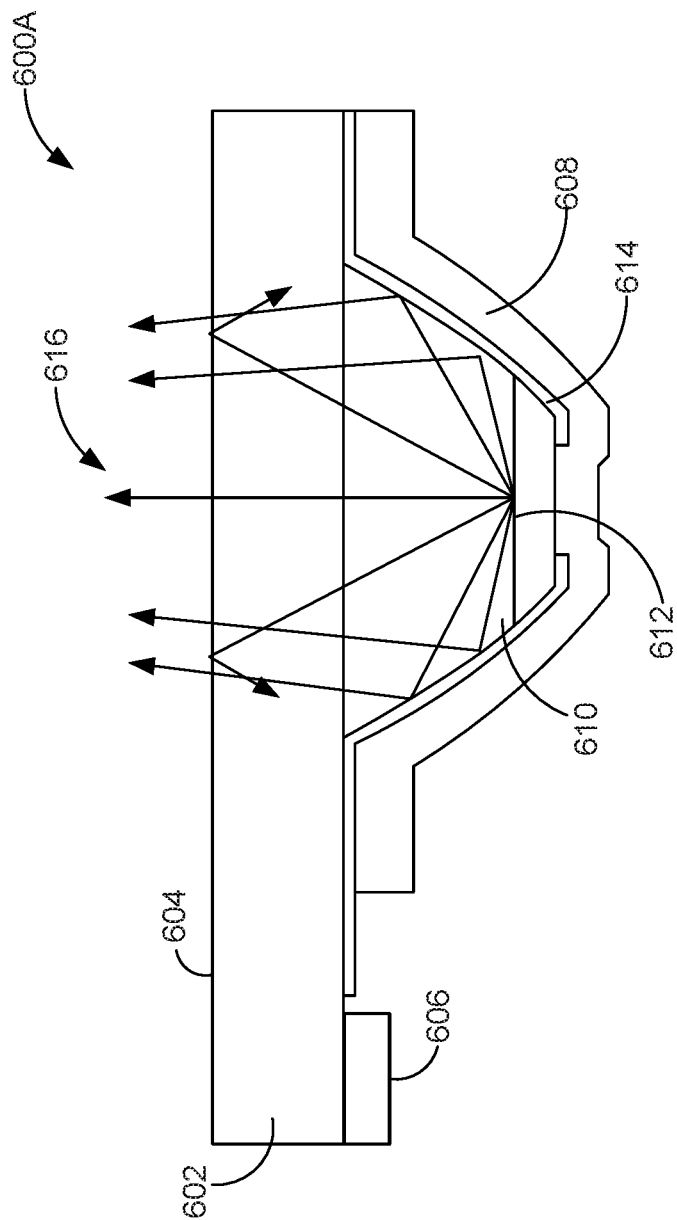
FIG. 6A is a cross-sectional diagram illustrating an embodiment of an LED, in accordance with one embodiment.

FIG. 6A is a cross-sectional diagram illustrating an LED 600A, in accordance with one embodiment. LED 600A may be a light-emitting component (LEC) included in any of the emitter arrays discussed herein. As such, LED 600A may be included in a head-mounted device (HMD), such as but not limited to HMD 100 of FIGS. 1A-1B. LED 600A may be an LED die. In various embodiments, LED 600A is a micro-LED (μLED), where the feature sizes are on the order of a few microns (μm) to hundreds of microns. In at least some embodiments, the feature size of LED 600A may be less than a micron (i.e., the feature size may be sub-micron). LED 600A is an example of an LED that may be positioned on and bonded to a surface of a display substrate (e.g., backplane 348 of FIGS. 3-4) to emit visible or invisible light. The target substrate may be a backplane for a display device, such as but not limited to backplane 348 of FIGS. 3-4.

In some embodiments, LED 600A is formed on a substrate layer (not shown in FIG. 6A), or semiconductor wafer, and includes, among other components a semiconductor layer 602, a dielectric layer 614 disposed on the semiconductor layer 602, a p-contact 608 disposed on a first portion of the dielectric layer 614, and an n-contact 606 disposed on a second portion of the semiconductor layer 602. The semiconductor layer 602 may be formed on a substrate layer, such as but not limited to a gallium substrate layer. Thus, semiconductor layer 602 may be a gallium (Ga) semiconductor layer. Note that semiconductor layer 602 may be formed of other semiconductor lattices or materials, such as gallium nitride (GaN), gallium phosphide (GaP), gallium arsenide (GaAS), or any other semiconductor material appropriate for the fabrication of an LED. Note that this discussion of LED 600A is non-limiting, and LED 600A may be formed via other semiconductor lattices other than gallium-based lattices. In some embodiments, the semiconductor layer 602 is formed on the substrate layer as an epitaxial layer.

The p-contact 608 and the n-contact 606 are the electrical contacts coupled to the p-type and n-type regions of LED 600A, respectively. That is, p-contact 608 may be employed to electrically couple the p-type region of LED 600A to other semiconductor devices, such as but not limited to a target substrate. Likewise, n-contact 606 may be employed to electrically couple the n-type region of LED 600A to other semiconductor devices. For example, p-contact 608 and n-contact 606 may be bonded to corresponding electrical contacts of a backplane to bond LED 600A to the backplane. P-contact 608 and n-contact 606 may singly, or collectively, be referred to as electrical contacts, electrical interconnects, electrical leads, or contact pads of LED 600A. In some embodiments, p-contact 608 and n-contact 606 may include metal bumps. In some non-limiting embodiments, p-contact 608 and n-contact 606 may be comprised of a copper-tin (CuSn) alloy.

LED 600A may be less than 100 microns in diameter with a parabolic structure etched onto the LED die during wafer processing to form a quasi-collimated light beam emerging from the light-emitting face 604. In at least one embodiment, LED 600A may be less than 100 microns in diameter. LED 600A may include highlight extraction efficiency and outputs quasi-collimated light because of its shape. As shown in FIG. 6A, semiconductor layer 602 may be shaped into a mesa-structure 610. An active (or light-emitting) layer 612 (or 'active light-emitting area") is included in the mesa-structure 610. The active layer 612 may correspond to the region of the band gap of LED 600A. A voltage difference applied across the p-contact 608 and the n-contact 606 may result in the active layer 612 emitting visible or invisible photons (i.e., light). The mesa 610 has a truncated top, on a side opposed to the light-emitting face 604. The mesa 610 also has a curved or near parabolic shape to form a reflective enclosure for light within LED 600A. The arrows 616 show how light emitted from the active layer 612 is reflected off the walls of the mesa 610 toward the light-emitting face 604 at an angle sufficient for the light to escape the LED 600A (e.g., within the angle of total internal reflection).

The structure of LED 600A results in an increase in the efficiency of light emission when compared to unshaped or conventional LED chips. As such, the LED 600A produces light visible to the human eye with reduced current (e.g., nano-amps of drive current). LED 600A is an example of an LED die, although other types of LED dies may be assembled onto a backplane for a display, as discussed herein.

Figure 6B:
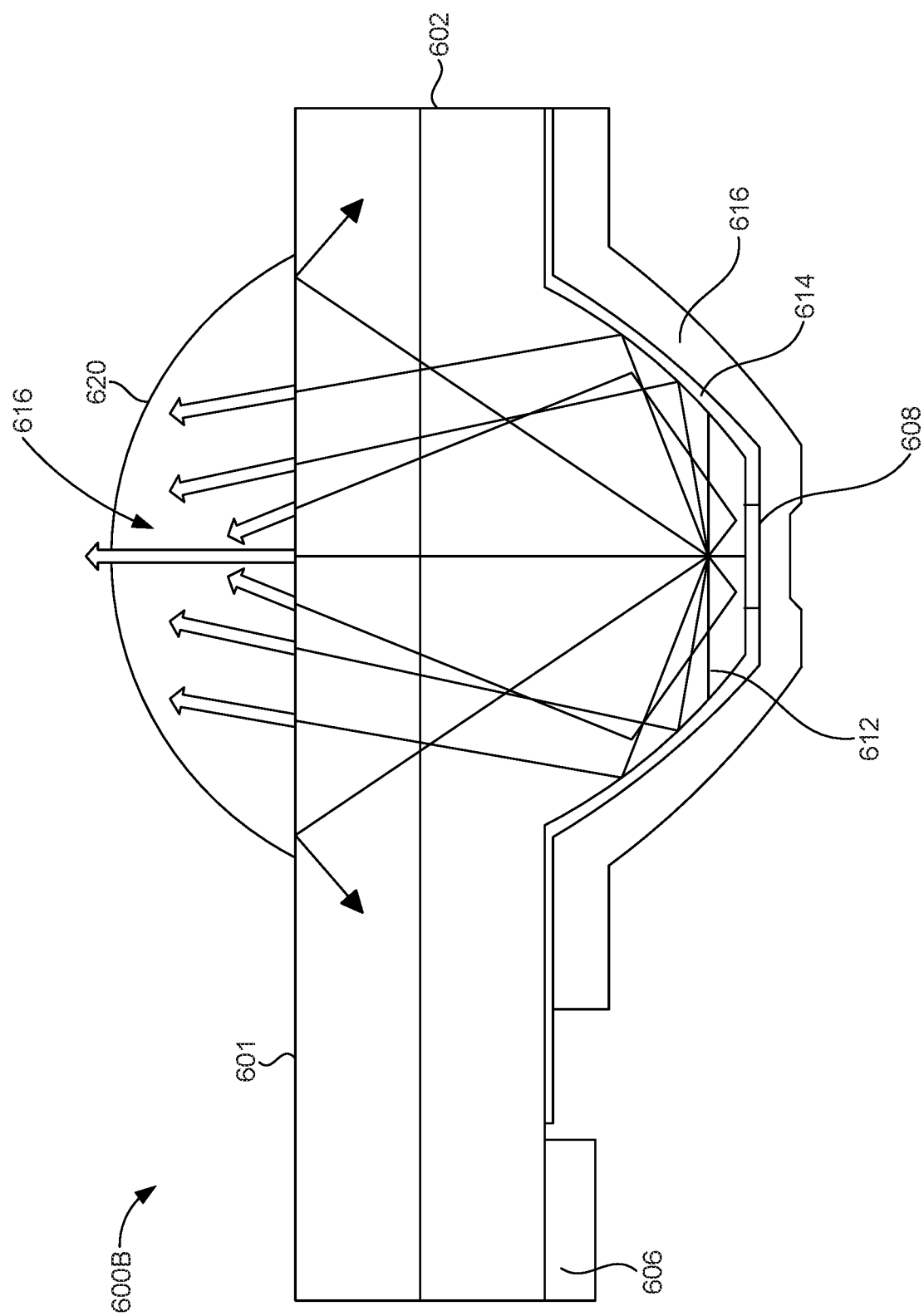
FIG. 6B is a cross-sectional diagram illustrating another embodiment of an LED, in accordance with one embodiment.

FIG. 6B depicts a μLED 600B that is similar in many respects to the μLED 600A of FIG. 6A. The μLED 600B may further include a μlens 620, which may be formed over the parabolic structure. In some embodiments, the μlens 620 may be formed by applying a polymer coating over the μLED 600A, patterning the coating, and reflowing the coating to achieve the desired lens curvature. The μlens 620 may be disposed over an emissive surface to alter a chief ray angle of the μLED 600B. In another embodiment, the μlens 620 may be formed by depositing a μlens material above the μLED 600A (for example, by a spin-on method or a deposition process). For example, a μlens template (not shown) having a curved upper surface can be patterned above the μlens material. In some embodiments, the μlens template may include a photoresist material exposed using a distributing exposing light dose (e.g., for a negative photoresist, more light is exposed at a bottom of the curvature and less light is exposed at a top of the curvature), developed, and baked to form a rounding shape. The μlens 620 can then be formed by selectively etching the μlens material according to the μlens template. In some embodiments, the shape of the μlens 620 may be formed by etching into the substrate 601. In other embodiments, other types of light-shaping or light-distributing elements, such as an annular lens, Fresnel lens, or photonic crystal structures, may be used instead of μlenses. Note that in FIG. 6B, a metal reflector layer 616 is disposed on the dielectric layer 614 and p-contact 608, although the metal reflector layer 616 may be omitted.

In some embodiments, μLED arrangements other than those specifically discussed above in conjunction with FIGS. 6A and 6B may be employed as a μLED in any of the various embodiments of emitter arrays discussed herein. For example, the μLED may include isolated pillars of epitaxially grown light-emitting material surrounded by a metal reflector. The pixels of an emitter array may also include clusters of small pillars (e.g., nanowires) of epitaxially grown material that may or may not be surrounded by reflecting material or absorbing material to prevent optical crosstalk.

In some examples, the μLED pixels may be individual metal p-contacts on a planar, epitaxially grown LED device, in which the individual pixels may be electrically isolated using passivation means, such as plasma treatment, ion-implantation, or the like. Such devices may be fabricated with light extraction enhancement methods, such as μlenses, diffractive structures, or photonic crystals. Other processes for fabricating the μLEDs of the dimensions noted above other than those specifically disclosed herein may be employed in other embodiments.

Rows of LEDs for an Emitter Array

Figure 7A:
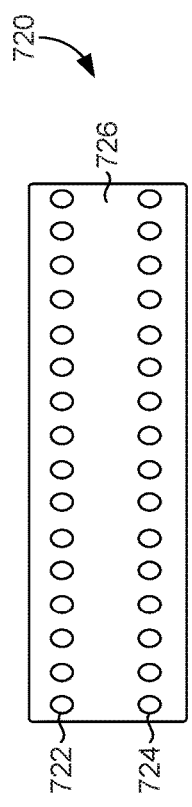
FIG. 7A is a top-view diagram illustrating multiple LED dies integrated into a monolithic LED chip, in accordance with one embodiment.

FIG. 7A is a top-view diagram illustrating multiple LED dies integrated into a monolithic LED chip, in accordance with one embodiment. Monolithic LED chip 720 includes sixteen integrated LED dies, such as but not limited to LED 600A and 600B of FIGS. 6A and 6B. Each of the individual integrated LEDs includes two electrical contacts, corresponding to p-contact 608 and n-contact 606 of LED 600A. Although the electrical contacts are indicated by ovals on the top surface 726 of monolithic LED chip 720, the electrical contacts are located on the bottom surface of monolithic LED chip 720, which is not shown in FIG. 7A. The ovals are shown on the top surface 726 for the reader's clarity. The two contacts of a first LED of monolithic LED chip 720 are labeled 722 and 724. In some embodiments, electrical contact 722 is the p-contact for the first LED and electrical contact 724 is the n-contact for the first LED. In other embodiments, electrical contact 722 is the n-contact for the first LED and electrical contact 724 is the p-contact for the first LED.

Although not indicated in FIG. 7A, the top surface 726 of monolithic LED chip 720 includes sixteen light-emitting surfaces, such as but not limited to light-emitting surface 604 of LED 600A, where each of the sixteen LEDs includes one of the sixteen light-emitting surfaces. Each light-emitting surface is positioned between the n-contact and the p-contact for the corresponding LED. FIG. 7A is intended as an example only, and is non-limiting. Other configurations of monolithic LED chips are possible. For example, FIG. 7C shows monolithic LED chips with eight integrated LED dies. Other numbers of LED dies integrated into a monolithic LED chip and physical layouts of LED dies are possible for monolithic LED chips.

Figure 7B:
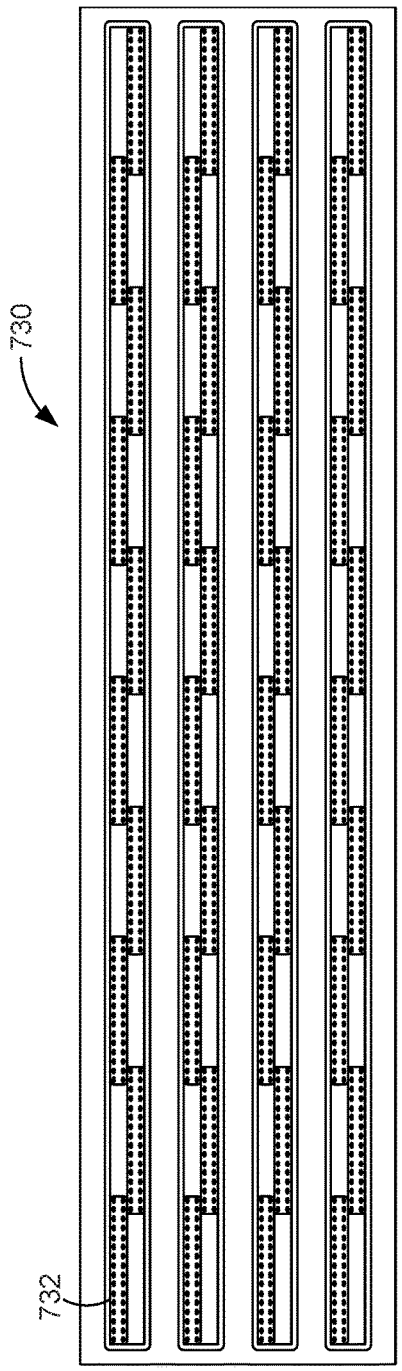
FIG. 7B is a top-view diagram illustrating multiple monolithic LED chips positioned on a carrier substrate, in accordance with one embodiment.
Figure 7C:
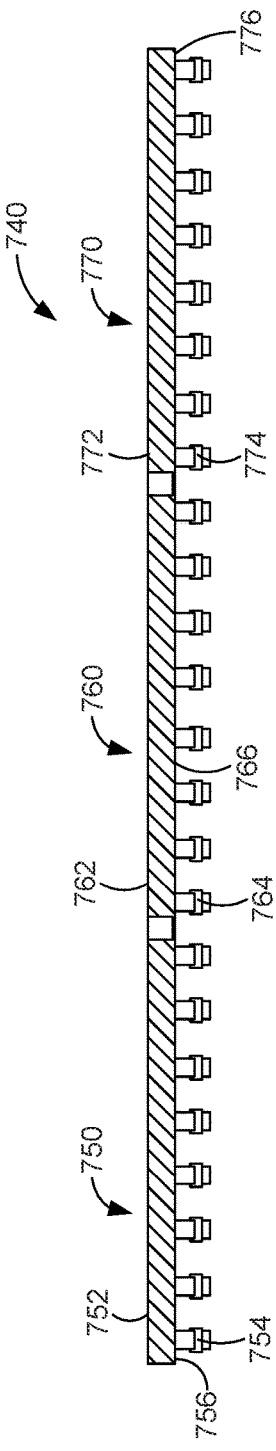
FIG. 7C is a side-view diagram illustrating a row of LEDs that includes three monolithic LED chips, in accordance with one embodiment.

FIG. 7B is a top-view diagram illustrating multiple monolithic LED chips positioned on a carrier substrate, in accordance with one embodiment. As shown in FIG. 7B, carrier substrate 730 is carrying forty monolithic LED chips. In FIG. 7B, one of the forty monolithic LED chips is labeled as monolithic LED chip 732. Each of the monolithic LED chips may be similar to monolithic LED chip 720 of FIG. 7A. A pick and place head (PPH) may transport monolithic LED chips from carrier substrate 730 to a target substrate (not shown in FIG. 7B). Carrier substrate 730 may be a processed LED wafer.

FIG. 7C is a side-view diagram illustrating a row of LEDs that includes three monolithic LED chips. LED row 740 includes three monolithic LED chips: first monolithic LED chip 750, second monolithic LED chip 760, and third monolithic LED chip 770. Each of monolithic LED chips 750/760/770 may be similar to at least one of monolithic LED chip 720 of FIG. 7A or monolithic LED chip 732 of FIG. 7B. In contrast to monolith LED chips 720/732, each of the three monolithic LED chips 750/760/770 includes eight (rather than sixteen) integrated LED dies, such as but not limited to LED 600A of FIG. 6A.

First monolithic LED chip 750 includes a first upper surface 752 and a first lower surface 756. Second monolithic LED chip 760 includes a second upper surface 762 and a second lower surface 766. Third monolithic LED chip 770 includes a third upper surface 772 and a second lower surface 776. Each of the upper surfaces 752/762/772 includes eight light-emitting surfaces of the eight LEDs integrated into the respective monolithic LED chips 750/760/770. Each of the lower surfaces 756/766/776 includes sixteen electrical contacts, two for each of the eight integrated LEDs. Due to the side-view of LED row 740, only one of the two electrical contacts for each LED is visible in FIG. 7C. That is, only the first of two electrical contacts for each LED are shown in FIG. 7C. The corresponding second electrical contacts for each of the LEDs are hidden behind the shown first electrical contacts. First monolithic LED chip 750 includes a first electrical contact 754 for a first LED of first monolithic LED chip 750. Second monolithic LED chip 760 includes a first electrical contact 764 for a first LED of second monolithic LED chip 760. Third monolithic LED chip 770 includes a first electrical contact 774 for a first LED of third monolithic LED chip 770. In some embodiments, electrical contacts 754/764/774 are n-contacts. In other embodiments, electrical contacts 754/764/774 are p-contacts.

In some embodiments, the LEDs integrated in each of monolithic LED chips 750/760/770 all emit the photons (i.e., light) of the same (or nearly the same) frequency (or wavelength). In other embodiments, the LEDs integrated in first monolithic LED chip 750 emit photons of a first frequency, the LEDs integrated in second monolithic LED chip 760 emit photons of a second frequency, and the LEDs integrated in third monolithic LED chip 770 emit photons of a third frequency. For example, first monolithic LED chip 750 may emit red (R) light, second monolithic LED chip 760 may emit green (G) light, and third monolithic LED chip 770 may emit blue (B) light. A RGB pixel, including each of a red-emitting LED, a green-emitting LED, and a blue-emitting LED may be constructed by arranging multiple LED rows together of the various LED colors. In other embodiments, LED row 740 may be integrated into emitter arrays, such as but not limited to emitter arrays 254A-254C of FIGS. 3-4. LED row 740 is an exemplary embodiment of a row of LEDs, and other configurations and arrangements of monolithic LED chips may be employed to generate a row of LEDs and/or pixels for a display device, such as but not limited to HMD 100 of FIGS. 1A-1B.

Application of Underfill Via Centrifugal Force

Generally, during the manufacture and assembly of electronic display devices and other types of electronics, various types of semiconductor devices can be electrically coupled, bonded, or affixed to one another. In a simple example, a light emitting component (LEC), such as an LED die, can be bonded to a backplane, a printed circuit board (PCB), or some other target substrate. In another example, any of the monolithic LED chips described in connection with FIGS. 7A-7C may be affixed to a target substrate (such as a device backplane), and electrical contacts of the LED chips and the target substrate can be bonded together, as described in more detail below in connection with step 1040 of FIG. 10. This process may leave a gap between semiconductor devices in an integrated device.

Generally, an underfill (UF) material can be disposed around electrical bonds within a gap between bonded semiconductor devices of an integrated device in order to mechanically couple the semiconductor devices together and mechanically strengthen the electrical bonds in the gap. Thus, an uncured UF material may be distributed between the inner surfaces of the bonded semiconductor devices (e.g., into the gap between the bonded semiconductor devices), forming a sandwich with the semiconductor devices of the integrated device. To accomplish this, in some embodiments, uncured UF material may be applied to one edge of the gap, and capillary flow may be employed to distribute the uncured UF material into the gap. However, penetration of the UF material within the gap (e.g., the chip-backplane gap) may eventually reach a plateau. Thus, the uncured UF material may only penetrate a first portion of the gap (e.g., a maximum distance of penetration). Applying an accelerated motion can force the uncured UF material to travel further due to the generated force and can create an underfill nanoparticle gradient distribution along the axis of accelerated motion. In some embodiments, the accelerated motion can be based on circular motion, and the applied force can be a centrifugal force that produces centrifugal motion. Thus, an accelerated motion can be employed to spread the uncured UF material into a second portion of the gap. In some embodiments, the accelerated motion may be employed to distribute the uncured UF material substantially uniformly within the gap. Under optimized conditions, the nanofiller content (e.g., silica nanoparticles) may spread uniformly with the UF base material throughout the area between chip and substrate. However, an underfill nanoparticle gradient distribution may be formed along an axis of the accelerated or centrifugal motion (e.g., radially outward). Once the uncured UF material has been spread out, one or more curing processes (e.g., thermal, room temperature, pulsed and/or scanned photon beams, and the like) may be employed to cure the sandwiched UF material.

Figure 8A:
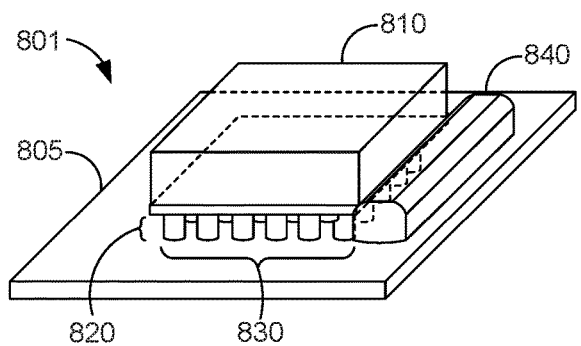
FIGS. 8A-8D include diagrams illustrating a centrifuge-driven system for applying underfill material, in accordance with various embodiments.
Figure 8B:
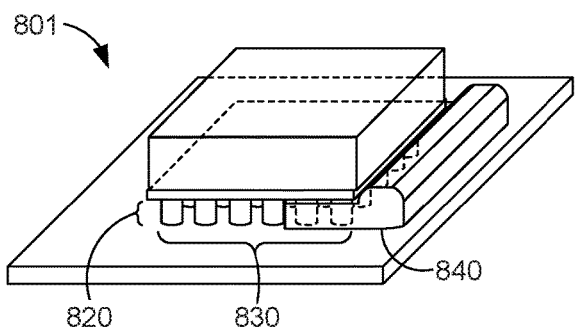
Figure 8C:
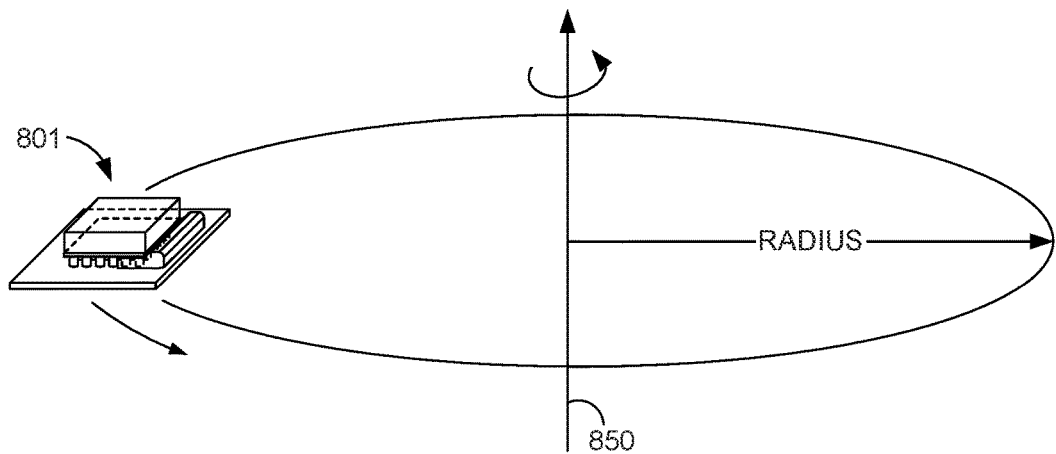

FIGS. 8A-8C illustrate a centrifuge-driven system for applying underfill material, in accordance with various embodiments. FIG. 8A illustrates an example integrated device 801 in which a first semiconductor device 810 is bonded to a second semiconductor device 805. In an example embodiment, the first semiconductor device 810 includes one or more light emitting components, such as light emitting diodes. For example, the first semiconductor device 810 may be any of the monolithic LED chips described in connection with FIGS. 7A-7C. The second semiconductor device 805 may be a target substrate, such as a device backplane. The process of electrically bonding the electrical contacts of the first semiconductor device 805 and the second semiconductor device 810, and/or annealing the electrical bonds, may leave a vertical gap 820 surrounding the electrical contacts 830 in the integrated device 801.

Uncured UF material 840 may initially be dispensed at one edge of the gap 820, as illustrated in FIG. 8A. In various embodiments, an UF applicator device (e.g., a dispensing tool or dispensing robot) and/or an UF application process may be employed to apply and/or deposit the uncured UF material 840. In a simple example, UF application can be carried out by drop-casting (e.g., using a pipette). In another example, UF application can be carried out using a dedicated dispensing tool equipped with a nozzle to allow UF material to controllably pass through (such as in a continuous flow mode or in a jetting mode by spraying fine UF droplets, i.e., spray coating). The dispensed UF material may be applied with a height and/or volume that depends on or otherwise corresponds to the gap that it needs to fill. Generally, the thickness of the UF material at the edge of the chip may depend on the chip-substrate gap height (and/or bump height). However, the dispensed UF material may be applied with a thickness that is greater than the chip-substrate gap height such that the volume of the dispensed UF material corresponds with the volume of the chip-substrate gap to fill. By way of nonlimiting example, to fill a gap 820 of 1 µm, the height of dispensed UF material 840 may be approximately 100-200 µm. Initially, capillary flow may be employed to distribute the UF material 840 into the gap 820. However, penetration of the uncured UF material 840 within the gap 820 may eventually reach a plateau or maximum length of penetration, as illustrated in FIG. 8B. Thus, the uncured UF material 840 may only penetrate a first portion of the gap.

To fill a second portion of the gap, accelerated motion may be employed. For example, as illustrated in FIG. 8C, the integrated device 801 may be affixed to a motion generator, such as a centrifuge, and spun. For example, the centrifuge may have a test plate (e.g., a circular plate) configured to rotate around an axis of rotation that is substantially orthogonal to the plate, and the integrated device 801 may be affixed to the plate. For example, the integrated device 801 may be mounted via a mounting plate or some other mechanical coupling. A substantially planer dimension of the integrated device 801 may be positioned parallel to the surface of the plate (e.g., such that a bottom surface of the second semiconductor device 805 rests on the plate, or on some coupling thereof). Further, the integrated device 801 may be mounted with an orientation such that the edge of the gap 820 with the uncured UF material 840 faces radially inward, such that an applied circular motion will distribute the uncured UF material 840 radially outward and into the gap 820. Although some embodiments are described in which the uncured UF material 840 is applied before affixing the integrated device 801 to the centrifuge, this need not be the case. Furthermore, it should be understood that the use of a centrifuge is meant simply as an example, and any suitable technique for applying circular or linear motion can be implemented.

Continuing with the example above, any suitable centrifuge device may be employed to rotate the integrated device 801 and distribute the uncured UF material 840 into the gap 820. Generally, displacement from the axis of rotation (i.e., the radius) and rotational frequency can be selected based on a desired accelerated motion to be applied to the integrated device 801. For example, a centrifuge device with a radius between 2 and 10 centimeters may be employed with a rotational frequency between 1000 revolutions per minute (RPM) and 5000 RPM to produce an acceleration motion between around 20 and 3000 meters per second squared. In another embodiment, a centrifuge radius and rotational frequency may be selected to generate an accelerated motion between 500 and 5000 meters per second squared. In yet another example, some centrifuge devices such as spin coaters that can reach 12000 RPMs may be used in various embodiments. These are meant simply as examples, and any suitable configuration may be implemented. FIG. 8C illustrates an application of rotational motion to the integrated device 801 around rotational axis 850. Note that FIG. 8C may not be drawn to scale.

Figure 8D:
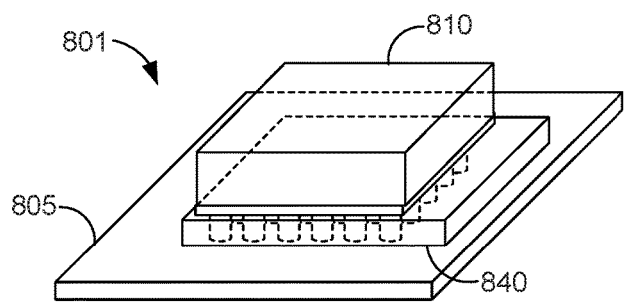

Generally, the application of accelerated motion (such as rotational motion) to the integrated device 801 generates a force (e.g., a centrifugal force) that serves to spread the uncured UF material 840 further into the gap 820 along the axis of accelerated motion (e.g., for centrifugal motion, radially outward), thereby forming a sandwich with the first semiconductor device 810 and the second semiconductor device 805 and encapsulating (e.g., an exposed portion of)

a plurality of the electrical contacts 830 in the gap. In some embodiments, the accelerated motion may be employed to distribute the uncured UF material 840 substantially uniformly within the gap 820. This is illustrated in FIG. 8D, in which the uncured UF material 840 has been spread out substantially uniformly within the gap 820. In some embodiments, an excess portion of the uncured UF material 840 existing outside of the gap 820 may be removed, for example, via plasma etching or laser ablation.

One or more curing processes (e.g., thermal, room temperature, pulsed and/or scanned photon beams, and the like) may be employed to cure the sandwiched UF material 840, as described in more detail below in connection with FIG. 10. The cured UF material may also provide various benefits similar to those provided by conventionally applied and cured UF material, such as those associated with "flip-chip"-style packed semiconductor devices. For example, the cured UF material may redistribute any thermo-mechanical stress associated with a CTE mismatch between the semiconductor devices. Further, the cured UF material may mechanically couple the semiconductor devices (e.g., the LED dies to the backplane), and thus may mechanically stabilize any alignment and/or electrical coupling between the semiconductor devices in the integrated device. In some embodiments, the integrated device may then be packaged. For example, the integrated device may be electrically coupled to a circuit board and/or packaging boards with input/output (I/O) pins. Thus, a circuit board may be populated with mechanically stabilized semiconductor devices using the techniques described herein.

Generalized Processes for Applying Underfill Via Centrifugal Force

Figure 9:
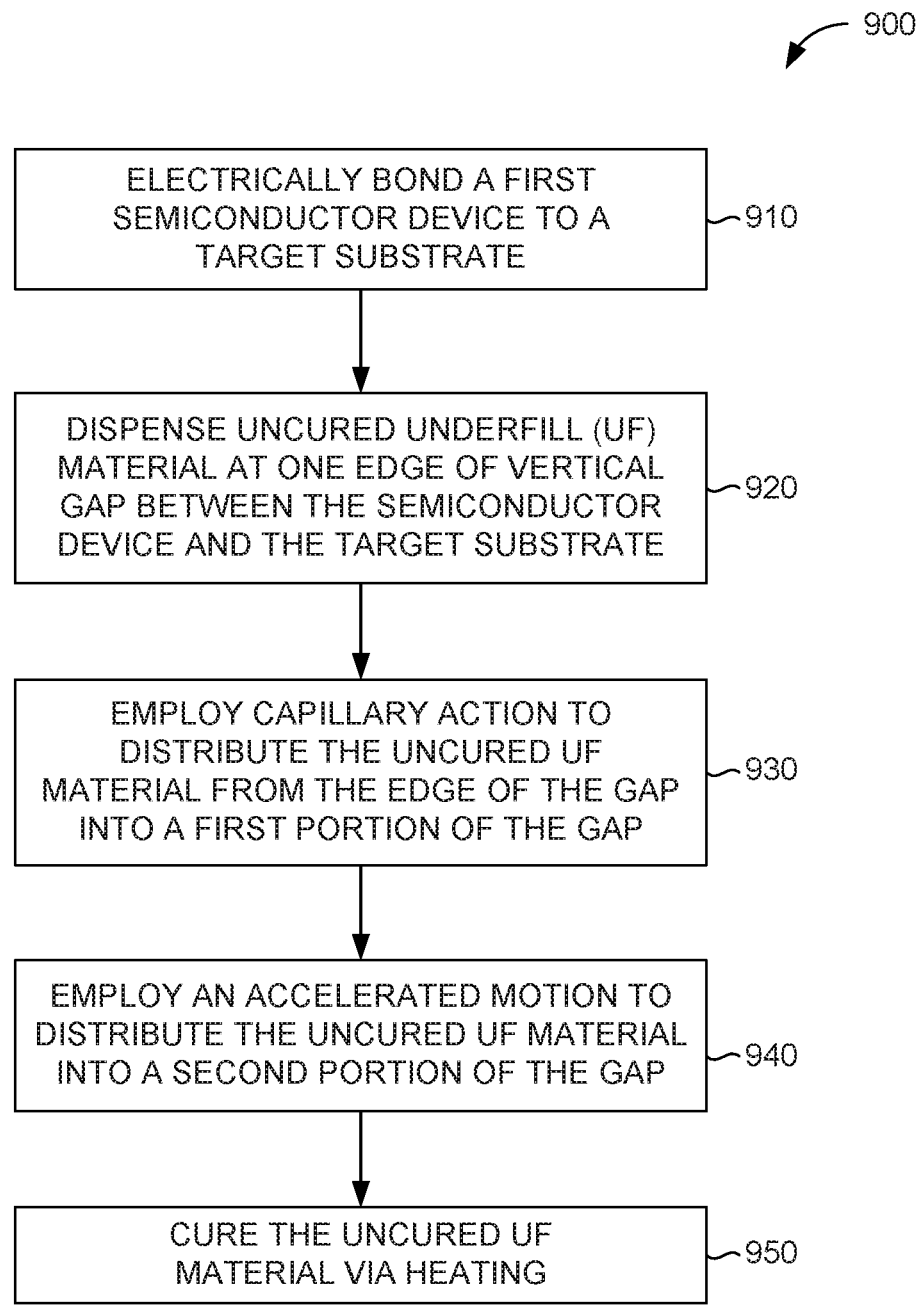
FIG. 9 illustrates one embodiment of a process for applying UF material via centrifugal force, in accordance with various embodiments.

FIG. 9 illustrates one embodiment of a process flow for applying UF material via centrifugal force. Process 900 may be employed to assemble a display device, such as but not limited to display device 104 of FIGS. 1A-1B and/or display device 1100 of FIG. 11. The various operations, blocks, actions, and/or steps of process 900 may be implemented via executing instructions on a processor device and/or controller device. When the instructions are executed, the processor device and/or controller device may cause the performance of the various operations, blocks, actions, and/or steps of process 900. The instructions may be stored on a non-transitory computer-readable storage medium and/or media.

As used herein, computer-readable storage media and/or medium can be any available media that can be accessed by a computing device and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computing device. Non-transitory computer-readable storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Process 900 begins at block 910, where a first semiconductor device is electrically bonded to a target substrate. Various types of first semiconductor devices may be used, such as semiconductor devices that may include a row of LEDs. In at least one embodiment, the LEDs included in the row of LEDs are similar to LED 600A of FIG. 6A and/or 600B of FIG. 6B. The LEDs may be µLEDs. The target substrate of process 900 may be a backplane for a display, such as but not limited to backplane 348 of FIGS. 3-4 and/or backplane 1102 of FIG. 11. In some embodiments, the row of LEDs is a first semiconductor device and the target substrate is a second semiconductor device. The first semiconductor device can be electrically bonded to the target substrate using any suitable technique, such as those described in U.S. application Ser. No. 16/748,692, entitled Selectively Bonding LED Devices Via a Pulsed Laser and filed on Jan. 21, 2020, the contents of which are herein incorporated by reference in their entirety.

Although process 900 is described in some embodiments with respect to light emitting diodes, in some embodiments, the semiconductor device of process 900 may be another type of light-emitting component (LEC). In still other embodiments, the semiconductor device need not be a light-emitting device at all. For example, the semiconductor device may include a transistor, a non light-emitting diode, a resistive element, a capacitor, a microelectromechanical (MEMs) device, and the like. In some embodiments, the semiconductor device may include a logic device (e.g., a processors and/or an array of logic gates), a memory device (e.g., a SRAM, DRAM, and/or EEPROM), or any other integrated circuit (IC) device. Additionally or alternatively, the semiconductor device may include a linear or a 2D array of semiconductor devices.

At block 920, uncured underfill (UF) material is dispensed at one edge of a vertical gap between the semiconductor device and the target substrate. The thickness of the UF material may be optimized based on bump height to ensure that, during curing, the UF material can expand enough to reach and adhere to the bottom side of the first semiconductor device.

At block 930, capillary action is applied to distribute the uncured UF material from the edge of the gap into a first portion of the gap. Generally, however, penetration of the UF material within the gap (e.g., the chip-backplane gap) may eventually reach a plateau. Thus, the uncured UF material may only penetrate the first portion of the gap, which may correspond to a maximum length of penetration.

At block 940, an accelerated motion is applied to distribute the uncured UF material into a second portion of the gap. Generally, applying an accelerated motion can force the uncured UF material to travel further due to the generated force. In some embodiments, the accelerated motion can be based on circular motion, and the applied force can be a centrifugal force. For example, the first semiconductor device and the target substrate may form an integrated device, which may be affixed to a centrifuge and spun. Generally, the displacement from the axis of rotation and rotational frequency can be selected based on a desired accelerated motion to be applied to the integrated device. Thus, an accelerated motion can be employed to spread the uncured UF material into a second portion of the gap. In some embodiments, the accelerated motion may be employed to distribute the uncured UF material substantially uniformly within the gap.

At block 950, the uncured UF material is cured via heating. In some embodiments, the curing process involves the application of localized thermal energy generated by a laser device. Any suitable curing process may be employed, such as those described below in connection with steps 1080 and 1090 of FIG. 10, and those described in U.S. application Ser. No. 16/748,692, entitled Selectively Bonding LED Devices Via a Pulsed Laser and filed on Jan. 21, 2020, the contents of which are herein incorporated by reference in their entirety.

Generalized Processes for Curing Underfill Material Via Lasers

Figure 10:
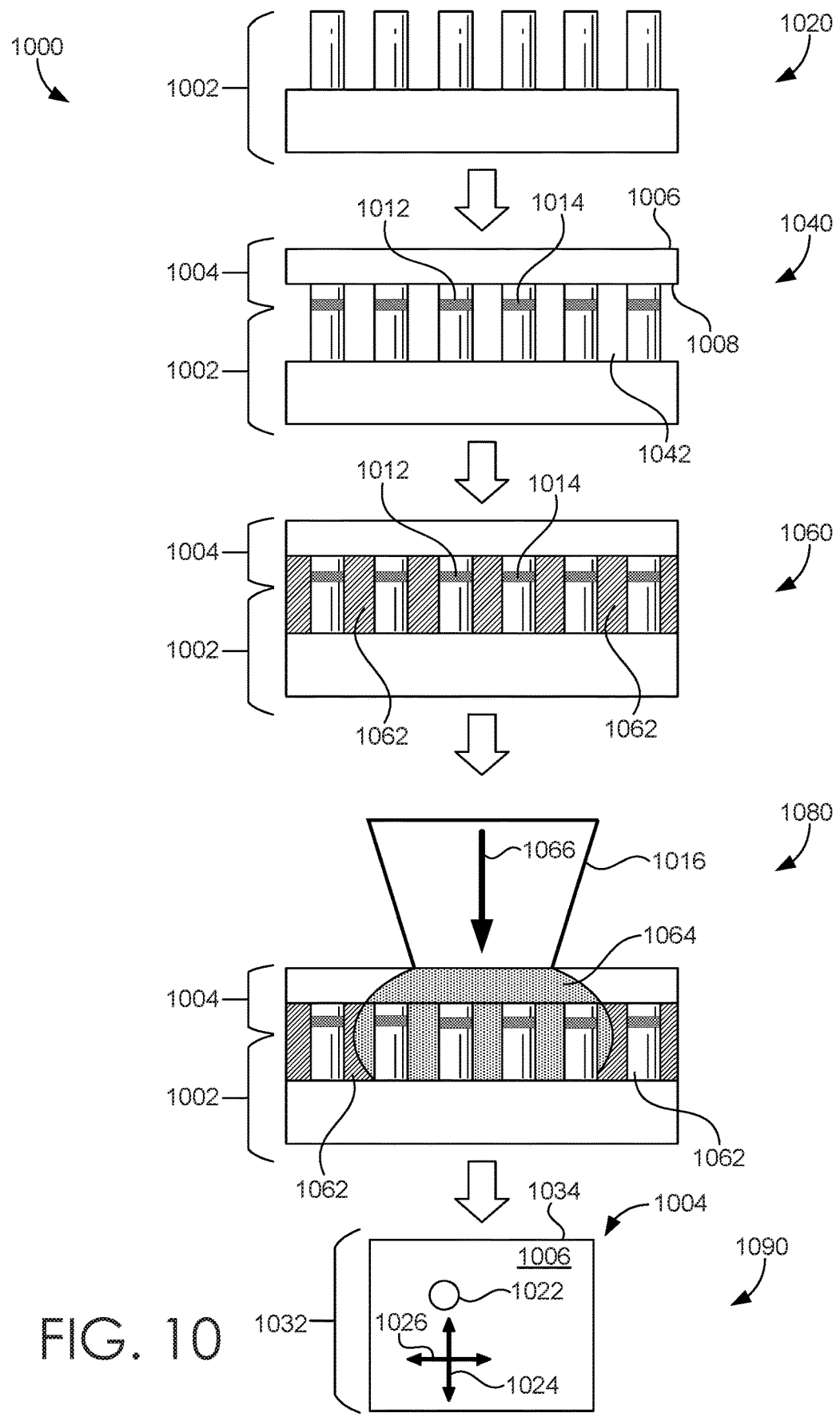
FIG. 10 illustrates an enhanced process flow for curing UF material via photon beams, that is consistent with the various embodiments.

FIG. 10 illustrates one embodiment of an enhanced process flow for curing underfill (UF) material via photon beams. Some embodiments of process 1000 are directed towards mechanically stabilizing electrical bonds between a first semiconductor device (e.g., semiconductor device 1004) and a second semiconductor device (e.g., target substrate 1002), via UF material. In process 1000, the UF material may be applied after the formation and/or annealing of the electrical bonds, via capillary flow of the uncured UF material and acceleration motion applied to the uncured UF material. Thus, the uncured UF material may be disposed intermediate the semiconductor device 1004 and target substrate 1002 "sandwich." Thus, the uncured UF material may be between and/or disposed on one or more inner surfaces of the "sandwich." The UF material may be similar to UF material employed in "flip-chip"-style semiconductor packaging.

More particularly, and in some embodiments, the uncured UF material may be applied post the electrical bonding and/or annealing of the electrical bonds. The UF material may be applied via capillary action (e.g., capillary flow) and/or distributed via accelerated motion, and one or more curing processes (e.g., thermal, room temperature, pulsed and/or scanned photon beams, and the like) may be employed to cure the sandwiched UF material. For example, the uncured UF material may be cured via one or more (continuous or pulsed) photon beams. The photon beam may be scanned. Furthermore, the spatial and/or temporal profile of the photon beam may be modulated to control for adverse thermal effects. The cured UF material may mechanically stabilize electrical bonds between the electrical contacts of the semiconductor device 1004 and the target substrate 1002.

Once cured, the UF material provides many similar benefits to conventionally applied and cured UF material, associated with "flip-chip"-style packed semiconductor devices. For example, the cured UF material may redistribute any thermo-mechanical stress associated with a CTE mismatch between the semiconductor device 1004 and the target substrate 1002. The cured UF material may mechanically couple the semiconductor device 1004 to the target substrate 1002, and thus may mechanically stabilize any alignment and/or electrical coupling between the semiconductor device 1004 and the target substrate 1002.

As noted above, process 1000 may be employed to cure UF material to mechanically stabilize one or more electrical bonds, which electronically couple semiconductor devices. More specifically, once applied and cured, the UF material may reduce the thermal effects associated with chip-backplane coefficient of thermal expansion (CTE) mismatch, which are discussed herein. Furthermore, the UF material may reduce the mechanical stress and strains exerted on the electrical bonds (e.g., due to thermal expansion), and redistribute these concentrated forces from the electrical bonds to larger portions of the semiconductor devices. For instance, concentrated pressures (e.g., compressive, sheering, and/or expanding pressures) exerted at the electrical bonds are distributed and reduced. The cured UF material may additionally protect the electrical bonds (and other components of the coupled semiconductor devices) against electromigration, moisture, thermal stress, mechanical shock, vibrational stress, and other elements of a hostile environment. The cured UF material may at least partially encapsulate mechanically sensitive portions (e.g., electrical bonds and/or contacts) of one or more semiconductor devices. The cured UF material may enhance the mechanical integrity of packing materials that encapsulate the one or more semiconductor devices. In at least one embodiment, the UF material provides adhesive (or binding) forces between two or more mechanically (and/or electrically) coupled semiconductor devices. Thus, once cured, the UF material may mechanically couple and/or bond semiconductor devices.

Step 1020 of process 1000 may include positioning a target semiconductor device (e.g., a backplane and/or target substrate 1002). At step 1040, another semiconductor device (e.g., semiconductor device 1004) is positioned proximate the target substrate 1004. Also, at step 1040, one or more electrical bonds may be formed, created, and/or generated between the electrical contacts of semiconductor device 1004 and target substrate 1002. For example, FIG. 10 shows a plurality of electrical bonds between the contacts, including but not limited to first electrical bond 1012 and second electrical bond 1014. The electrical bonds may be formed via any suitable technique (e.g., with one or more photon pulses to control thermal effects). In some embodiments, semiconductor device 1004 may be any of the semiconductor devices discussed herein. Semiconductor device 1004 may include an active layer (e.g., a layer of one or more quantum wells for the LEDs) disposed between a first surface 1006 and a second surface 1008 of semiconductor device 1004. Note that such an active layer is not explicitly shown in FIG. 10. Other embodiments are not so limited, and the target semiconductor device and/or the other semiconductor device may be virtually any semiconductor device. In at least one embodiment, the electrical bonds may have been annealed. Note that a volume surrounding the electrical contacts of the target substrate 1002 and the semiconductor device 1004, and disposed intermediate the target substrate 1002 and the semiconductor device 1004, defines a void 1042 that encapsulates the electrical contacts (and the electrical bonds).

At step 1060, uncured OF material 1062 is applied. The hatched volume 1062 indicates the OF material. Note that in applying the OF material 1062, the OF material 1062 may at least partially fill the void 1042. The OF material 1062 may be applied, post-electrical bonding of the target substrate 1002 and the semiconductor device 1004, via capillary action/flow, an OF reflow process, and/or an accelerated motion. In some embodiments, the OF material 1062 is applied prior to annealing the electrical bonds. In other embodiments, the UF material 1062 is applied post the annealing of the electrical bonds.

At step 1080, localized thermal energy is provided to cure the uncured UF material 1062. The hatch pattern 1064 represents the localization of the thermal energy. That is, the thermal energy is localized to the volume represented by the hatched pattern 1064. Thus, the localized thermal energy may be referred to as thermal energy 1064. The localized thermal energy 1064 may be provided by a photon source. For example, a photon source may transmit photon beam 1016, where the photon beam 1016 is absorbed by at least one of semiconductor device 1004 and/or target substrate 1002. The absorption of photon beam 1016 may induce the localized thermal energy 1064 that cures UF material 1062. The transmitted photon beam 1016 may be a photon beam that is in addition to a photon beam (e.g., a photon pulse) that provided the thermal energy that formed, created, and/or generated first electrical bond 1012 and/or may be in addition to the photon beam that annealed first electrical bond 1012. Thus, the thermal energy 1064 that cures UF material 1062 may be in addition to the thermal energy that formed first electrical bond 1012 and/or in addition to the thermal energy that annealed first electrical bond 1012. The photon source may be a laser, thus photon beam 1016 may be a laser beam. In various embodiments, photon beam may be a photon pulse with a temporal and/or spatial profile that is selected to control the thermal effects associated with the induced thermal energy. The temporal and/or spatial profile of the photon pulse 1016 may be selected, controlled, and/or modulated, to control any of various thermal effects that are associated with the thermal energy and/or the annealing of first electrical bond 1012, as discussed in any of the various embodiments. The temporal and/or spatial profile of the photon pulse 1016 may be selected to localize thermal energy 1064, as shown in FIG. 10.

In the embodiments shown in FIG. 10, the photon pulse 1016 irradiates the first surface 1006 of semiconductor device 1004. In other embodiments not shown in FIG. 10, photon pulse 1016 may irradiate target substrate 1002. In at least one embodiment, two or more photon pulses may be employed. For example, at least one of the photon pulses may irradiate semiconductor device 1004, while at least one other photon pulse may irradiate target substrate 1002. In various embodiments, the two of more photon pulses may by opposing photon pulses. Poynting vector 1066 illustrates the directional energy flux of photon pulse 1016.

In addition to selecting, modulating, and/or controlling the temporal and/or spatial profile of photon beam 1016, a wavelength of the photons of photon pulse 1016 may be selected such that the at least a substantial amount of the laser radiation associated with photon pulse 1016 is absorbed in a selected region of the semiconductor device 1004 and/or a selected region of the target substrate 1002. For example, when irradiating the first surface 1006 of semiconductor device 1004, the wavelength may be selected such that the laser radiation associated with photon beam 1016 is substantially absorbed by a portion or region of semiconductor device 1004 that is disposed between (or intermediate) the first surface 1006 and the second surface 1008 of semiconductor device 1004. In at least one embodiment, the wavelength is selected such that the laser radiation is substantially absorbed in a region disposed intermediate the irradiation surface (e.g., first surface 1006) and the active layer of semiconductor device 1004. Even though the laser radiation is substantially absorbed in a region that may be excluded from the active layer, and as shown in FIG. 10, at least a portion of the induced thermal energy may flow through the active layer and to the uncured UF material 1062, via heat diffusion or other heat transfer mechanisms. Thus, the wavelength of laser pulse 1016 (or any other laser/photon pulse and/or beam discussed herein) may be selected to avoid, mitigate, or at least decrease an amount of any damage to semiconductor device 1004 associated with the laser radiation, while still curing UF material 1062.

In some embodiments, wherein semiconductor device 1004 is comprised of gallium arsenide (GaAs), gallium nitride (GaN), or other gallium-based compounds, so that the laser radiation is substantially absorbed in the bulk material of semiconductor device 1004, the wavelength of the photons may be within the ultraviolet (UV) range. In at least one embodiment, the wavelength may be less than 360 nm. In other embodiments, the wavelength of the photons may be within the visible region of the electromagnetic (EM) spectrum. In still other embodiments, the wavelength of the photons is within infrared (IR) region of the EM spectrum. For example, the photon source may be a carbon dioxide ($CO_2$) laser, where the wavelength is on the order of 10.6 microns (e.g., a mid-IR laser).

In order to control the thermal effects, the temporal and/or spatial profile may be selected based on a heat diffusion length, which depends on the bulk material that the laser radiation will be transmitted through, as well as the laser pulse duration (e.g., temporal pulse width) and/or wavelength. The heat diffusion length may be at least approximately modeled to scale as, $l_t \approx \xi(D \cdot \tau)^{1/2}$, where D (thermal diffusivity) is dependent upon physical properties of the semiconductor material, $\tau$ represents the temporal pulse width, and is a geometric factor that depends on the geometry of the irradiated device (e.g., semiconductor device 1004 or target substrate 1002). In a non-limiting embodiment for GaN LEDs, $D_{GaN} \approx 0.43$ $cm^2$ $s^{-1}$. In some embodiments, the temporal pulse width may be within the range of 1 microsecond to 10 microseconds. The thermal heat diffusion length for GaN with temporal pulse widths on the order of 10 ns pulses may be approximately 6.5 In other embodiments, the temporal pulse width may be within the range of 10 nanoseconds to 1 microsecond, with a corresponding range of thermal heat diffusion lengths of 6.5 μm to 65 μm. In still other embodiments, the temporal pulse width may be within the range of 1 picosecond to 10 picoseconds, with a corresponding range of thermal heat diffusion lengths of 65 nanometers to 200 nanometers.

At step 1090, the photon source may scan the first surface 1006 of semiconductor device 1004 (and/or scanning a surface of target substrate 1002 if target substrate 1002 is being irradiated) to induce additional thermal energy to continue curing the UF material. That is, the photon source may be scanned and/or pulsed to provide the thermal energy required for curing the portion of the UF material 1062 excluded from the localization of thermal energy 1064. The step 1090 illustrates a top-down view of semiconductor device 1004 and the first surface 1006 of semiconductor device 1006. Also shown in step 1090 is an approximate beam spot 1022 of scanning photon pulse 1016. The scanning may be 1D scanning or 2D scanning, such as illustrated in arrows 1024 and 1026. In some embodiments, the scanning pattern may be at least similar to a Lissajous scanning pattern to further control thermal effects. For example, a precessing Lissajous (or Lissajous-like) scanning pattern may be employed to provide thermal energy to each of the electrical contacts, while still allowing enough thermal energy to dissipate and control for thermal effects.

The first surface 1006 may have a first spatial dimension 1032 and a second spatial dimension 1034. The spatial dimensions may be on the order of centimeters (cm) or millimeters (mm). For example, in one embodiment, the first spatial dimension 1032 may be approximately 4 mm and the second spatial dimension 1034 may be approximately 5 mm. The spatial dimensions 1032/1034 may vary in other embodiments. FIG. 10 may not be to scale. For example, beam spot 1022 may be significantly smaller in its characteristic feature size and/or spatial dimensions (e.g., the spatial pulse width), with respect to spatial dimensions 1032/1034, than is shown in FIG. 10. In some embodiments, the spatial pulse width of beam spot 1022 may be less than 0.5 mm. The scanning frequency and/or the pulsing frequency of the photon source and/or pulsed photon beam may be modulated to further control the thermal effects. The scanning may continue until the entirety of the UF material has been cured. Once the UF material is cured, the target substrate 1002 and the semiconductor 1004 may be mechanically coupled via the mechanical bond formed by the adhesive forces of the cured UF material. The mechanical coupling may stabilize the electrical coupling and/or electrical bonds between the target substrate 1002 and the semiconductor device 1004. Once electrically and mechanically coupled, the target substrate 1002 and the semiconductor device 1004 may form an integrated and/or composite semiconductor device.

Additional Display Devices

Figure 11:
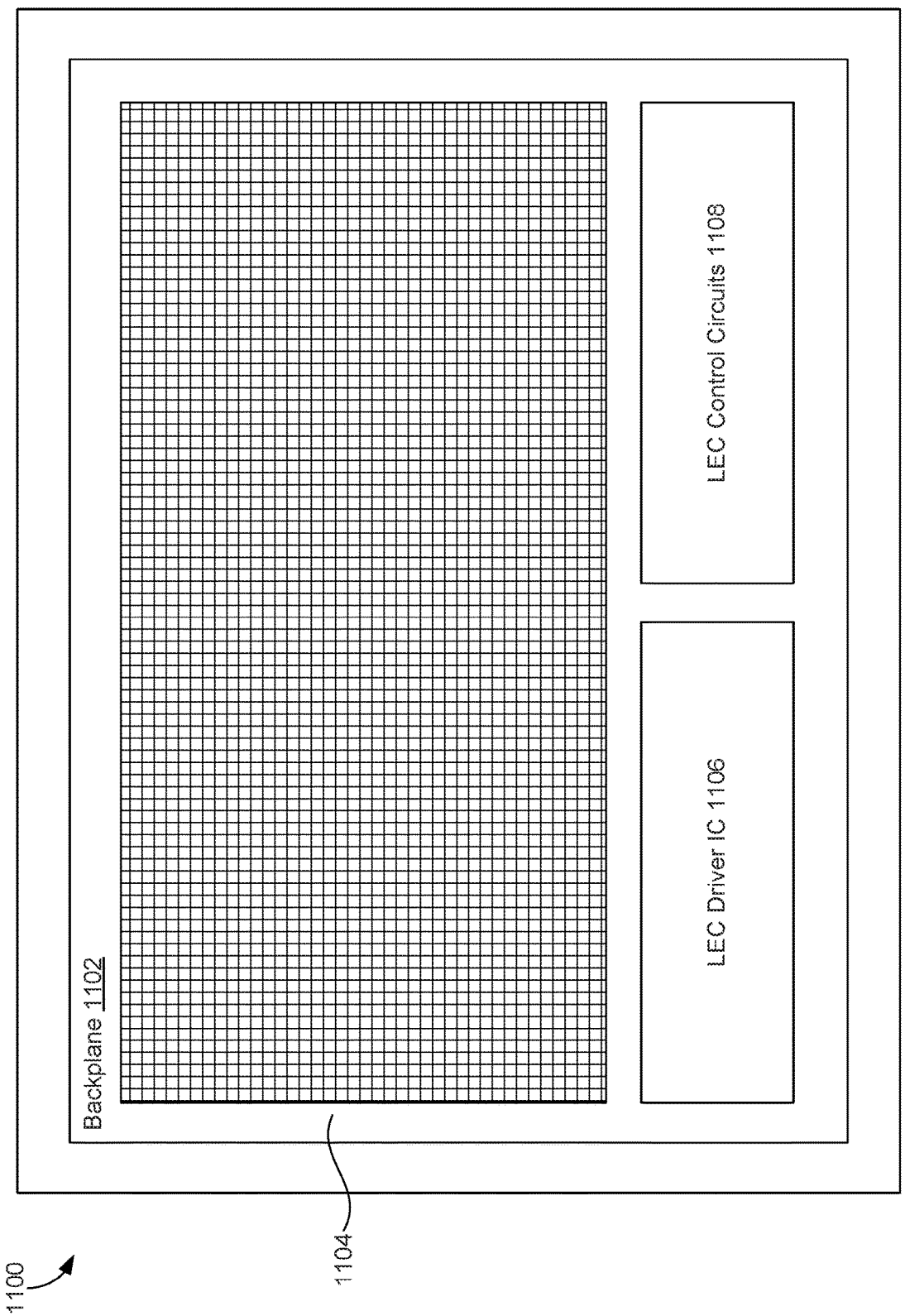
FIG. 11 schematically illustrates a display device that is consistent with the various embodiments.

FIG. 11 schematically illustrates a display device that is consistent with the various embodiments. Display device 1100 includes a display backplane 1102. The backplane 1102 may be a display substrate having a plurality of electrical contacts arranged thereon. A plurality of light-emitting components (LECs) may form a 2D array of pixels 1104. For example, each pixel of the array of pixels 1104 may include three LECs: a red (R) LEC, a green (G) LEC, and a blue (B) LEC. The three LECs may form an RGB pixel. As shown in FIG. 11, the pixels 1104 may be arranged in rows and columns of pixels. The LECs may be arranged in rows to form the rows and columns of pixels 1104. Each LEC may include one or more of electrical contacts. For instance, each LEC may include at least two electrical leads, e.g., an n-contact and a p-contact. The LECs may be LEDs or μLEDs. Thus, display device 1100 may be an LED display of a μLED display. A plurality of electrical couplings affixes the leads of the LECs to corresponding electrical contacts of the backplane 1102. The backplane 1102 may include LEC control circuits 1108 to control the operation of the LECs that comprise pixels 1104. Backplane 1102 may additionally include an LEC driver integrated circuit (IC) 1106.

In some embodiments, display device 1100 may be included in mobile, non-mobile, and/or wearable computing devices. For example, display device 1100 may be integrated into devices such as but not limited to smart phones, tablets, smartwatches, laptops, desktops, televisions (TVs), and head mounted devices, such as virtual reality (VR) and augmented reality (AR) devices. In various embodiments, display device 1100 may be included in display device 104 of FIGS. 1A-1B. That is, display device 1100 may be a near-eye display (NED) included in a head-mounted computing device, such as but not limited to HMD 100 of FIGS. 1A-1B. As such, backplane 1102 may be similar to backplane 348 of FIGS. 3-4.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method for applying uncured underfill (UF) material to a semiconductor device, the method comprising:
    forming an electrical bond, via a first laser beam, between the semiconductor device and a target substrate;
    applying the uncured UF material to a first portion of the semiconductor device, wherein the first portion of the semiconductor device is proximate to a gap in the semiconductor device;
    employing an accelerated motion of the semiconductor device to distribute the applied uncured UF material across a second portion of the semiconductor device, wherein the second portion of the semiconductor device includes the gap in the semiconductor device; and
    irradiating a third portion of the semiconductor device with a second laser beam different from the first laser beam that formed the electrical bond, wherein the second laser beam is scanned in a one-dimensional or two-dimensional scanning pattern, after the electrical bond formation and the uncured UF material application, to cure the distributed uncured UF material, and wherein the third portion of the semiconductor device includes a surface of the semiconductor device that is substantially parallel to the gap in the semiconductor device.

2. The method of claim 1, wherein the semiconductor device is an integrated device that includes a first semiconductor device, a second semiconductor device electrically bonded to the first semiconductor device, and the gap in the semiconductor device is a gap between the first semiconductor device and the second semiconductor device, wherein applying the uncured UF material to the first portion of the semiconductor device comprises dispensing the uncured UF material at an edge of the gap of the semiconductor device.

3. The method of claim 2, further comprising;
    employing a capillary action to distribute the uncured UF material from the edge of the gap into a first portion of the gap; and
    employing the accelerated motion of the semiconductor device to distribute the uncured UF material into a second portion of the gap.

4. The method of claim 1, wherein the accelerated motion of the semiconductor device is a rotational motion of the semiconductor device.

5. The method of claim 4, wherein a radius of the rotational motion of the semiconductor device is between 2 and 10 centimeters and a rotational frequency of the rotational motion is between 1000 revolutions per minute (RPM) and 12000 RPM.

6. The method of claim 1, further comprising employing a centrifuge device to generate the accelerated motion of the semiconductor device, wherein the accelerated motion is centrifugal motion, and wherein the distributed uncured UF material includes a nanoparticle gradient distribution along an axis of the centrifugal motion.

7. The method of claim 1, wherein an acceleration of the accelerated motion of the semiconductor device is between 500 and 5000 meters per second squared.

8. The method of claim 1, further comprising employing a laser device to generate the laser beam to cure the distributed uncured UF material.

9. The method of claim 1, wherein the semiconductor device includes a plurality of light-emitting diodes (LEDs).

10. The method of claim 1, further comprising packaging the semiconductor device into a display device of a head-mounted device comprising a virtual-reality device, an augmented-reality device, or a mixed-reality device.

\* \* \* \* \*